(12) United States Patent
Hsu et al.

(10) Patent No.: US 7,384,838 B2
(45) Date of Patent: Jun. 10, 2008

(54) SEMICONDUCTOR FINFET STRUCTURES WITH ENCAPSULATED GATE ELECTRODES AND METHODS FOR FORMING SUCH SEMICONDUCTOR FINFET STRUCTURES

(75) Inventors: Louis Lu-Chen Hsu, Fishkill, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 11/225,654

(22) Filed: Sep. 13, 2005

(65) Prior Publication Data

US 2007/0057325 A1    Mar. 15, 2007

(51) Int. Cl.
*H01L 21/8238*    (2006.01)
(52) U.S. Cl. ...................................... 438/230
(58) Field of Classification Search .............. None
See application file for complete search history.

(56) References Cited

U.S. PATENT DOCUMENTS

| | | | |
|---|---|---|---|
| 5,793,082 A * | 8/1998 | Bryant ..................... 257/330 |
| 6,610,576 B2 * | 8/2003 | Nowak ..................... 438/301 |
| 6,657,252 B2 * | 12/2003 | Fried et al. ................ 257/316 |
| 6,800,885 B1 * | 10/2004 | An et al. ................... 257/275 |
| 6,924,178 B2 * | 8/2005 | Beintner .................... 438/157 |
| 7,176,092 B2 * | 2/2007 | Yeo et al. .................. 438/283 |

* cited by examiner

*Primary Examiner*—Evan Pert
*Assistant Examiner*—Ben P Sandvik
(74) *Attorney, Agent, or Firm*—Wood, Herron & Evans, LLP

(57) ABSTRACT

Semiconductor structures in which the gate electrode of a FinFET is masked from the process introducing dopant into the fin body of the FinFET to form source/drain regions and methods of fabricating such semiconductor structures. The gate doping, and hence the work function of the gate electrode, is advantageously isolated from the process that dopes the fin body to form the source/drain regions. The sidewalls of the gate electrode are covered by sidewall spacers that are formed on the gate electrode but not on the sidewall of the fin body.

14 Claims, 24 Drawing Sheets

SEMICONDUCTOR FINFET STRUCTURES WITH ENCAPSULATED GATE ELECTRODES AND METHODS FOR FORMING SUCH SEMICONDUCTOR FINFET STRUCTURES

FIELD OF THE INVENTION

The invention relates generally to semiconductor structures and, in particular, to semiconductor structures with encapsulated FinFET's and methods of forming such semiconductor structures.

BACKGROUND OF THE INVENTION

Progressive miniaturization of feature sizes in circuit elements has improved the performance and increased the functional capability of integrated circuits. Fin-type field effect transistors (FinFET's) are low-power, high speed devices that can be more densely packed on a substrate than planar transistors. A conventional FinFET structure includes a narrow vertical fin of single crystal semiconductor material and a gate electrode that intersects a channel region of the fin. The gate electrode is isolated electrically from the fin by a thin dielectric layer. Flanking the central channel region on opposite ends of the vertical fin are source/drain regions. Because of the fabrication process, the fin has a width that is less than the minimum lithographic dimension and a relatively high aspect ratio.

After the gate electrode is formed, the gate dielectric covers the entire sidewall of the fin. Consequently, the gate dielectric must be removed from the exposed ends of the fin to create the source/drain regions by introducing a dopant concentration into the opposite ends of the fin. The dopant concentration may be introduced into the fin by angled ion implantation or by gas phase diffusion doping. However, the stage in the fabrication process that introduces the dopant into the source/drain regions also modifies the doping in the gate electrode because the gate electrode is exposed to the process introducing the dopant into the opposite ends of the fin. Consequently, the gate doping, and hence the work function of the gate electrode, is strongly coupled with the process that dopes the source/drain regions and is altered by the source/drain doping process. For example, the gate work function in an n-channel FinFET may be highly influenced by the high concentration n-type doping of the source/drain regions because of the additional concentration of n-type dopant introduced into the gate electrode by the process doping the source/drain regions.

What is needed, therefore, is a semiconductor structure in which a dopant concentration may be introduced into the fin of a FinFET to form source/drain regions without co-doping the gate electrode and methods of fabricating such semiconductor structures that overcome the various disadvantages of conventional semiconductor structures and conventional methods of manufacturing such semiconductor structures.

SUMMARY OF THE INVENTION

The present invention is generally directed to a semiconductor structure in which the gate electrode is masked from the process introducing a dopant concentration into the fin of the FinFET to form source/drain regions and methods of fabricating such semiconductor structures. This decouples the gate doping, and hence the work function of the gate electrode, from the process that dopes the source/drain regions.

In accordance with one aspect of the present invention, a semiconductor structure comprises a fin body on a dielectric substrate and a gate electrode intersecting a central channel region of the fin body. The gate electrode, which is also on the dielectric substrate, includes a first surface coextensive with the dielectric substrate, a sidewall, and a second surface connected by the sidewall with the first surface. A cap of a first dielectric material covers the second surface of the gate electrode, a cap spacer flanks the cap, and a first sidewall spacer of a second dielectric material underlies the cap spacer and covers the sidewall of the gate electrode. The sidewall spacer and the cap spacer operate to mask the gate electrode when, for example, the first and second ends of the first feature, which flank the central channel region, are doped to form source/drain regions of a FinFET.

In accordance with another aspect of the present invention, a method for fabricating a FinFET structure comprises forming a fin of semiconductor material having a central channel region and first and second end regions flanking the central channel region, forming a gate electrode intersecting the central channel region of the fin, and introducing a dopant into the first and second end regions of the fin to define source/drain regions. The method further comprises masking a sidewall of the gate electrode before the dopant is introduced into the first and second end regions of the fin body to inhibit the introduction of the dopant into the sidewall of the gate electrode.

In accordance with another aspect of the present invention, a method for fabricating a semiconductor structure comprises forming a first feature having a first sidewall and forming a second feature having a second sidewall. The method further includes forming a sidewall spacer on the second sidewall of the second feature and masking the first sidewall of the first feature when the sidewall spacer is formed on the second sidewall of the second feature.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1A:
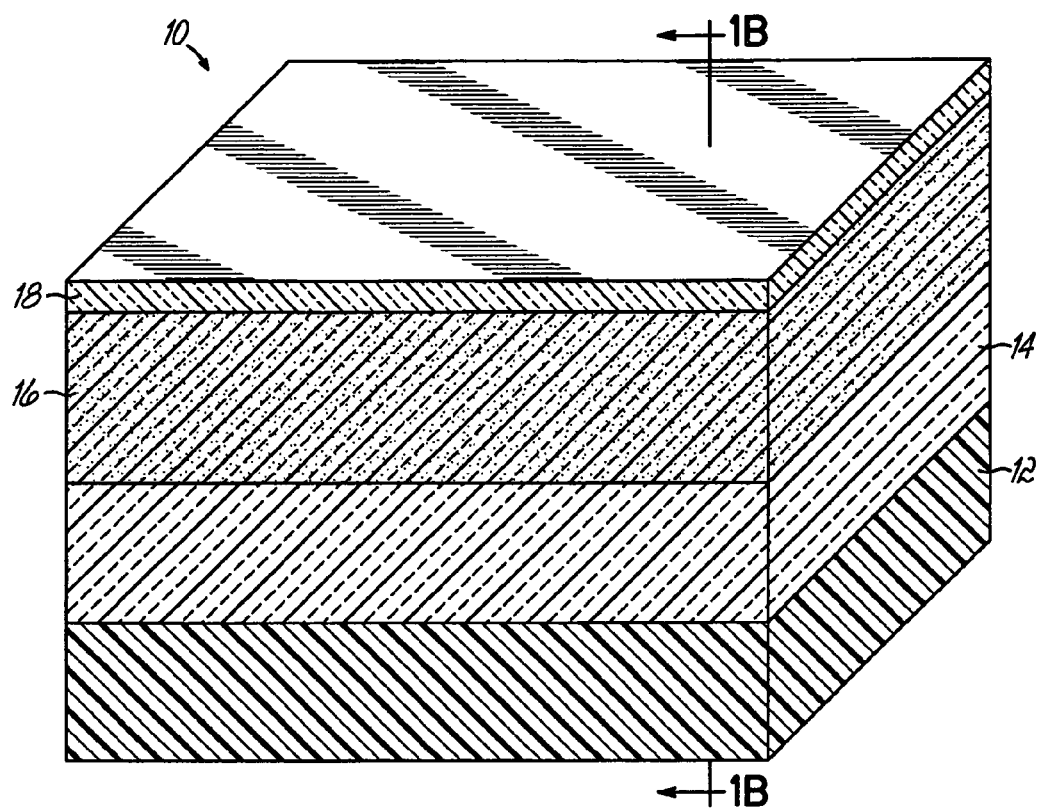
FIGS. 1-8 are diagrammatic views of a portion of a substrate at various fabrication stages of a processing method in accordance with an embodiment of the present invention wherein A represents an isometric view and B is a corresponding cross-sectional view taken generally along lines B-B in A.
Figure 1B:
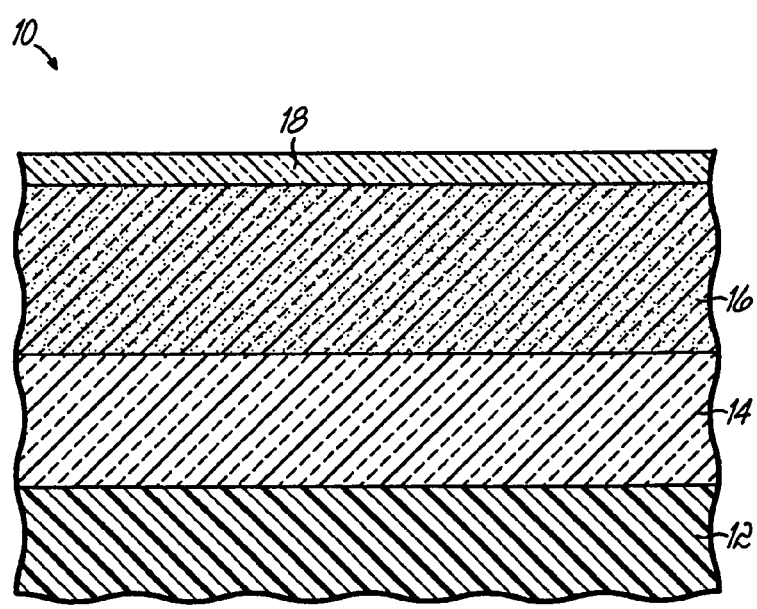

The present invention provides a semiconductor structure including fin-type field effect transistors (FinFET's) built on a semiconductor-on-insulator (SOI) wafer, as well as methods of making such semiconductor structures. Specifically, in one embodiment, the present invention is directed to semiconductor structure in which a dopant concentration may be introduced into the source/drain regions of a FinFET without affecting the dopant concentration of the gate electrode and methods of fabricating such semiconductor structures. The principles of the present invention may also be advantageous for forming interconnect metallization lines and the like. The present invention will now be described in greater detail by referring to the drawings that accompany the present application.

With reference to FIGS. 1A,B, a semiconductor wafer 10 comprises a semiconductor-on-insulator (SOI) substrate that includes a semiconductor substrate 12, which may be single crystal or monocrystalline silicon, a buried dielectric layer 14, and an active semiconductor or SOI layer 16 separated from the semiconductor substrate 12 by the intervening buried dielectric layer 14. The SOI layer 16, which is considerably thinner than the semiconductor substrate 12 and also may be single crystal or monocrystalline silicon, is electrically isolated from the semiconductor substrate 12 by the buried dielectric layer 14. The semiconductor wafer 10 may be fabricated by any suitable conventional technique, such as a wafer bonding technique or a separation by implantation of oxygen (SIMOX) technique, familiar to persons of ordinary skill in the art.

The stoichiometry of the constituent compound forming the buried dielectric layer 14 may be expressed by a chemical or molecular formula, as understood by a person having ordinary skill in the art. If the buried dielectric layer 14 is oxide, the stoichiometry may be expressed by the molecular formula $SiO_x$, where the variable x represents the nominal proportion of oxygen atoms to silicon atoms in the constituent compound and may have any suitable value.

A pad layer 18 is formed on the SOI layer 16 across the surface of semiconductor wafer 10. The pad layer 18 may be composed of silicon nitride ($Si_3N_4$) formed utilizing a conventional deposition process such as chemical vapor deposition (CVD) or plasma-assisted CVD. The hardness and wear resistance of pad layer 18 is adequate to function as a hardmask and as a polish stop layer during subsequent fabrication stages. The material forming pad layer 18 must also etch selectively to the material constituting the SOI layer 16. The vertical thickness of the pad layer 18 is preferably about 20 nanometers (nm) to about 200 nm.

Figure 2A:
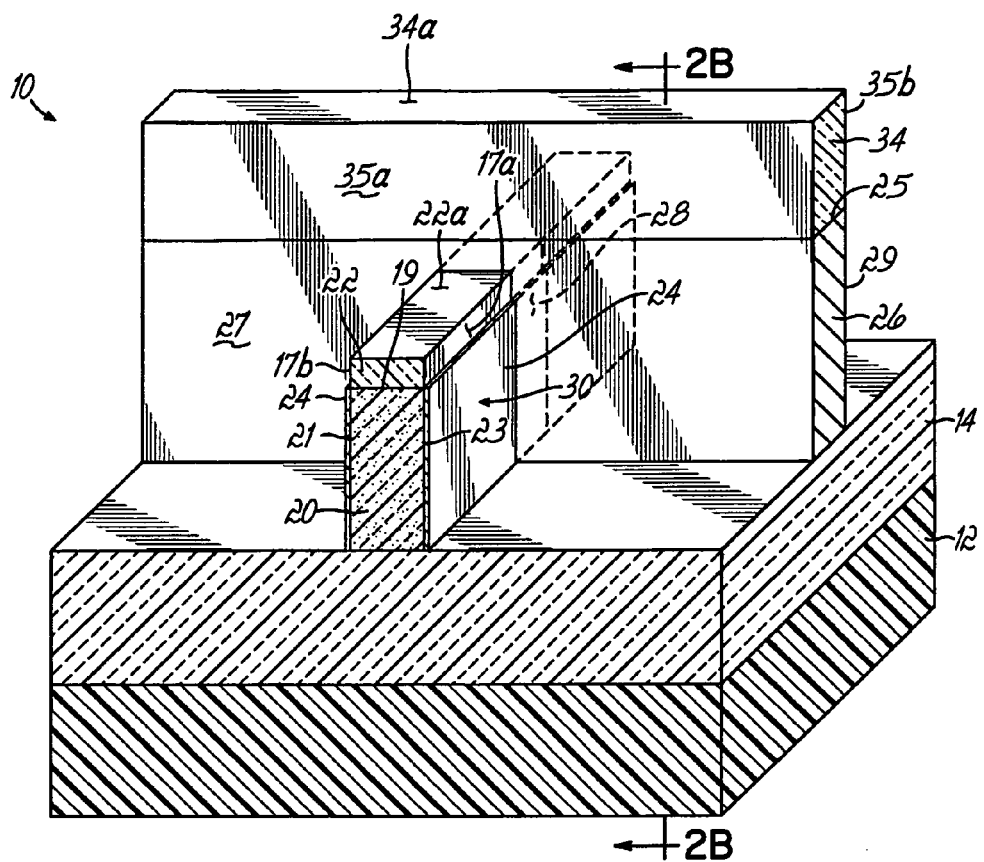
Figure 2B:
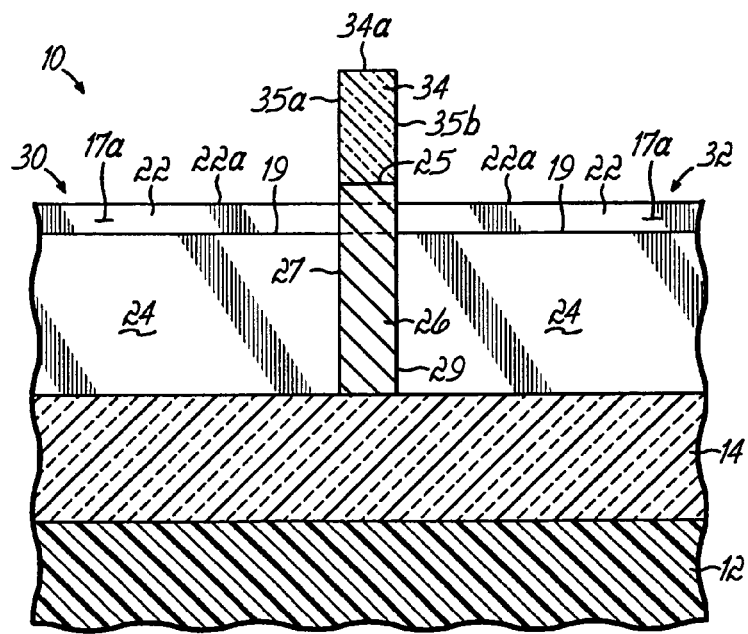

With reference to FIGS. 2A,B in which like reference numerals refer to like features in FIGS. 1A,B and at a subsequent fabrication stage, a plurality of fins, of which one representative fin body or fin 20 is depicted, are defined from the material of the SOI layer 16 (FIGS. 1A,B) across semiconductor wafer 10 by a conventional lithography and etching process that patterns the SOI layer 16 (FIGS. 1A,B) by removing unprotected portions of the constituent semiconductor material of SOI layer 16. The lithography process applies a resist (not shown) on pad layer 18 (FIGS. 1A,B), exposes the resist to a pattern of radiation, and develops the transferred pattern in the exposed resist. The pattern is transferred to the SOI layer 16 by a series of anisotropic dry etches, such as reactive-ion etching (RIE) or a plasma etching process, that patterns the pad layer 18 using the patterned resist as an etch mask and then patterns the SOI layer 16 using the patterned pad layer 18 as an etch mask and selective to the buried dielectric layer 14.

Fin 20 is a thin upright portion of the semiconductor material originally constituting SOI layer 16 and, thus, has a "fin" type shape. A residual cap 22, which represents the remainder of the pad layer 18 after etching, overlies an upper surface 19 of each fin 20 in a stacked spatial arrangement. Optionally and before the formation of fin 20, the thickness of the SOI layer 16 may be increased to accommodate the desired fin height by epitaxial growth of the constituent semiconductor material (e.g., silicon) of SOI layer 16. The height of each fin 20 typically ranges from about 30 nm to about 300 nm, the width of each fin 20 typically ranges from about 10 nm to about 100 nm, and the thickness of the cap 22 on each fin 20 may be between about 20 nm and about 200 nm. Cap 22 has substantially the same width and length as the fin 20 and also has an upper surface 22a and an upper surface 22a that is remote from the interface with upper surface 19 of the fin 20.

A gate dielectric 24, which may comprise a dielectric or insulating material like silicon dioxide, silicon oxynitride, a high-k dielectric, or any other suitable dielectric or combinations thereof, is then formed on opposite sidewalls 21, 23 of the fin 20. The dielectric material constituting gate dielectric 24 is preferably between about 1 nm and about 10 nm thick, and may be formed by thermal reaction of the semiconductor material of the fin 20 with a reactant, CVD, a physical vapor deposition (PVD) technique, or a combination thereof.

A gate electrode 26 is then formed with an alignment that intersects the sidewalls 21, 23 of the fin 20 along a central channel region 28. Typically, the portion of the gate electrode 26 intersects the fin 20 with an orthogonal relative alignment. The material forming the gate electrode 26 flanks both sides of the channel region 28 and the sidewalls 21, 23 of the fin 20 are separated physically from the gate electrode 26 by the intervening portions of the gate dielectric 24. A bridge of the conductor material constituting gate electrode 26 extends across the cap 22 of fin 20 and is electrically insulated from the fin 20 by the dielectric material of the cap 22. Opposite end regions 30, 32 of fin 20, which flank the channel region 28, project or protrude outwardly from opposite sidewalls 27, 29 of the gate electrode 26. The width of the fin 20 may be selected such that the central channel region 28 of the fin 20 is fully depleted during operation when an appropriate potential is applied to the gate electrode 26.

An upper surface 25 of the gate electrode 26 is covered by a cap 34, which may originate from a patterned etch mask used to form the gate electrode 26, in a stacked arrangement. Cap 34 has substantially the same width and length as the gate electrode 26 and an upper surface 34a that is remote from the interface with upper surface 25 of the gate conductor 26. Cap 34 further includes vertical sidewalls 35a, 35b that extend substantially vertically from the interface of cap 34 with upper surface 25 of gate conductor 26 to the upper surface 34a.

The gate electrode 26 may be formed by a conventional process that is initiated by depositing a layer of a suitable conductor material and planarizing the deposited layer with a conventional planarization process like chemical mechanical planarization (CMP). After planarization to remove excess conductor material, an upper surface of the deposited conductor layer is vertically above the upper surface of the cap 22 on fin 20. A hardmask layer, of which the residual cap 34 is visible in FIGS. 2A,B, is then formed over the planarized surface of the conductor layer by a conventional deposition processes, such as silicon nitride deposited by a CVD process. Typically, the thickness of the hardmask layer is from about 20 nm to about 200 nm. The conductor layer and the overlying hardmask layer are then patterned and anisotropically etched (e.g. RIE) by a conventional lithography and etching process to define the gate electrode 26 and cap 34. The cap 34 represents a residual portion of the hardmask layer and masks the underlying conductor material during the anisotropic etching process that removes the conductor material selective to the hardmask material. The anisotropic etching process also exposes the upper surface of the buried dielectric layer 14 by removing the conductor layer in regions unmasked by the patterned hardmask layer.

The constituent material of gate electrode 26 may comprise heavily doped polycrystalline silicon (polysilicon), a silicide, a metallic nitride, a refractory metal such as tungsten or titanium, or combinations thereof. The conductive properties and the work function of the constituent material of gate electrode 26 are established at this fabrication stage in the process as the gate electrode 26 is shielded against additional doping by cap 34 and sidewall structure formed in subsequent fabrication stages.

Figure 3A:
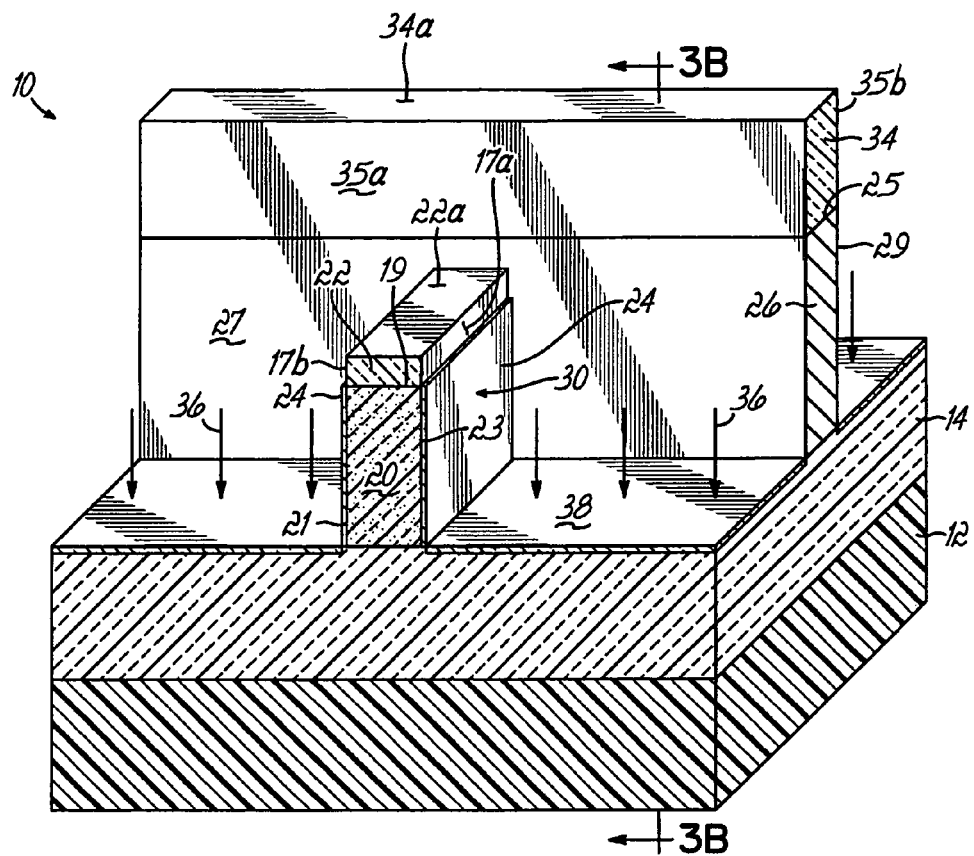
Figure 3B:
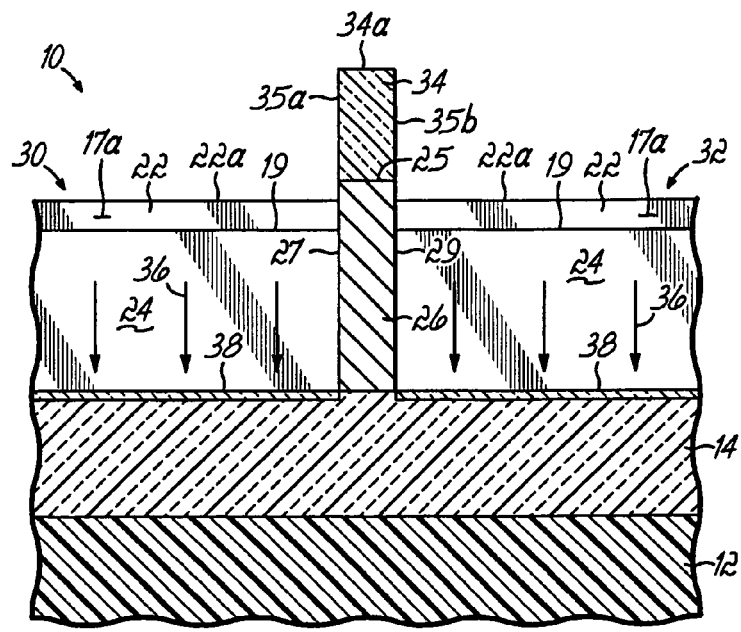

With reference to FIGS. 3A,B in which like reference numerals refer to like features in FIGS. 2A,B and at a subsequent fabrication stage, the buried dielectric layer 14 is ion implanted with a flux of low energy ions 36 to create a depth profile of implanted ions across a shallow depth of the buried dielectric layer 14 and near the exposed surface of the buried dielectric layer 14. Preferably, the implantation of ions 36 is performed with the semiconductor wafer 10 held at, or near, room or ambient temperature, although the invention is not so limited. The caps 22, 34 vertically mask the underlying fin 20 and gate electrode 26, respectively, from receiving a dose of the implanted ions 36. The species of ions 36 implanted into the buried dielectric layer 14 may be any species that operates, when chemically combined with the constituent dielectric material of the buried dielectric layer 14, as an etch stop layer with an etch selectivity that differs from that of the material constituting dielectric layer 40 (FIGS. 4A,B).

In one embodiment of the present invention, the buried dielectric layer 14 may be a BOX layer containing stoichiometric oxide ($SiO_2$), and atomic or molecular nitrogen ions are implanted into the BOX layer at a kinetic energy between from 5 keV and 30 keV and at a dose between about $1\times10^{13}$ cm$^{-2}$ to about $1\times10^{16}$ cm$^{-2}$. For an exemplary kinetic energy of 10 keV, the peak in a depth profile of atomic nitrogen ions implanted at in $SiO_2$ lies at a depth that is about 40 nm below the exposed surface of the buried dielectric layer 14. As is apparent to a person ordinarily skilled in the art, a series of several relatively low dose implantations may be substituted for a single implantation of a higher implantation dose and/or a series of implantations at different kinetic energies (i.e., different ranges) may be substituted for a single implantation at one kinetic energy.

Following implantation with ions 36, semiconductor wafer 10 is annealed at a temperature and for a time that promotes chemical combination of the implanted ions 36 with the dielectric material of the buried dielectric layer 14 across the implanted depth to form a modified region 38. The anneal may be performed in either an inert or vacuum environment, where an inert environment may comprise, for example, a non-reactive atmosphere of helium (He), argon (Ar), or nitrogen ($N_2$). The composition of the modified region 38 within the buried dielectric layer 14 differs from the composition of regions of the buried dielectric layer 14 that underlie the fin 20 and gate electrode 26, which are shielded from the impinging ions 36 during the implantation process. For nitrogen implanted into a buried dielectric layer 14 of $SiO_2$, the anneal may be performed at a temperature between about 800° C. and about 1100° C. to cause nitrogen in the implanted depth profile to combine with $SiO_2$ to form a modified region 38 composed of silicon nitride rich oxynitride ($SiO_xN_y$).

Figure 4A:
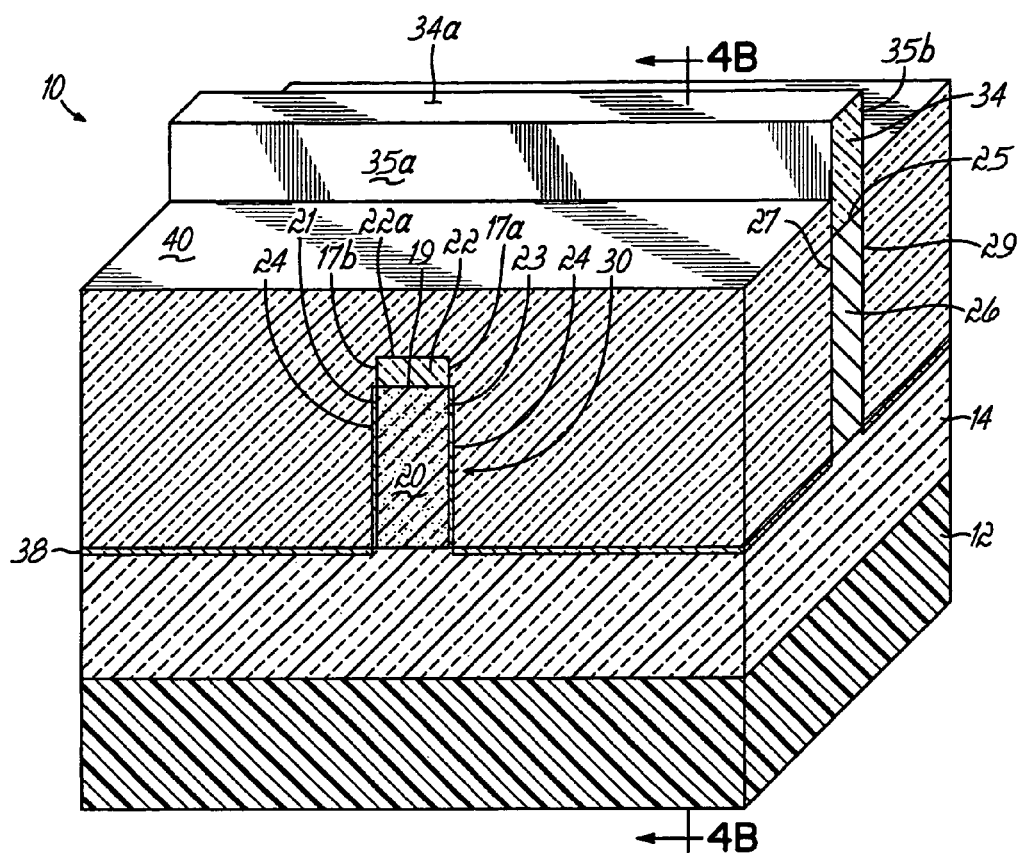
Figure 4B:
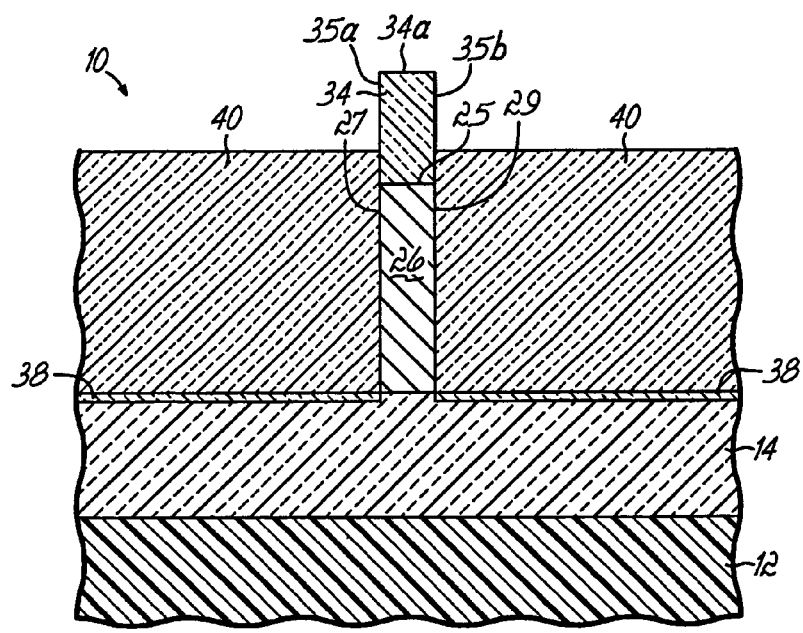

With reference to FIGS. 4A,B in which like reference numerals refer to like features in FIGS. 3A,B and at a subsequent fabrication stage, a layer 40 of a dielectric material, such as a soft CVD oxide like undensified tetraethylorthosilicate (TEOS), is deposited on semiconductor wafer 10 with a thickness sufficient to cover the top surface of the cap 34 over the gate electrode 26. The dielectric layer 40 is then planarized with a conventional planarization process, like a CMP process that removes excess dielectric material, to the top surface of the cap 34. The dielectric layer 40 is then recessed vertically by an anisotropic etch that removes the constituent material of the dielectric layer 40 selective to the material forming the cap 34. Typically, the dielectric layer 40 is recessed vertically to a depth relative to the interface of cap 34 with upper surface 25 of gate conductor 26 that uncovers the majority (i.e., between one-half to three-quarters) of the vertical sidewalls 35a,b of cap 34.

Figure 5A:
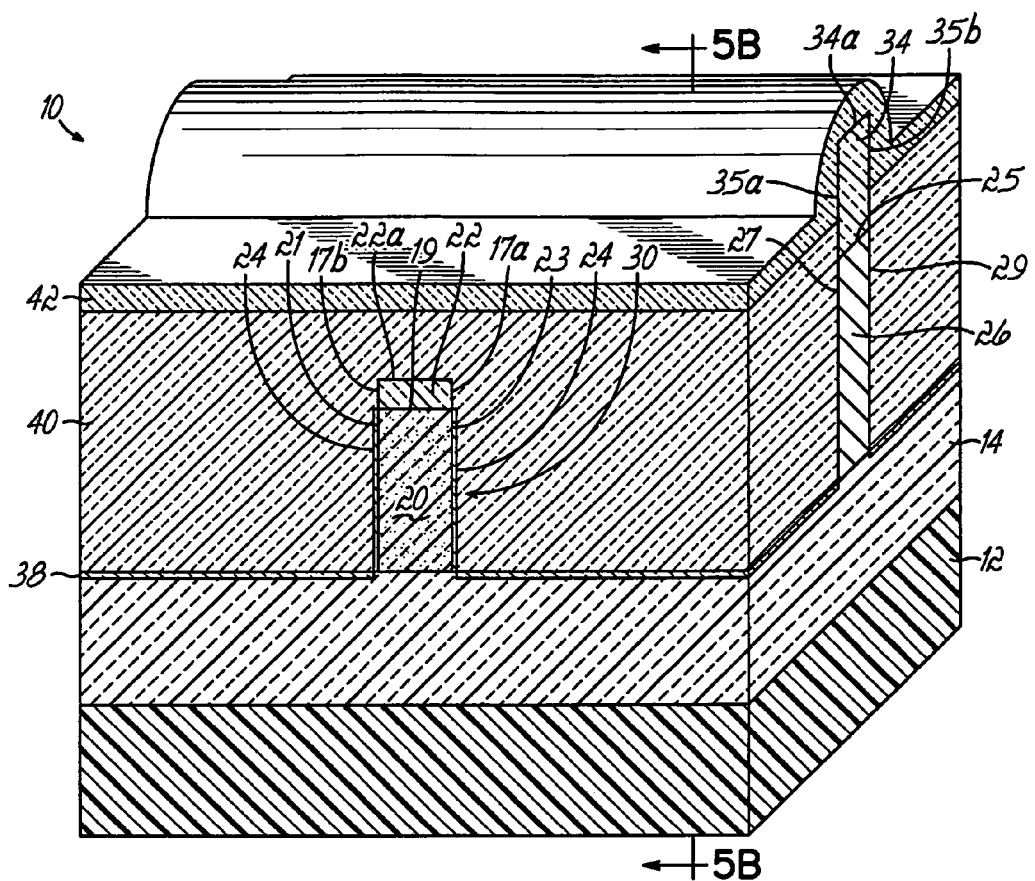
Figure 5B:
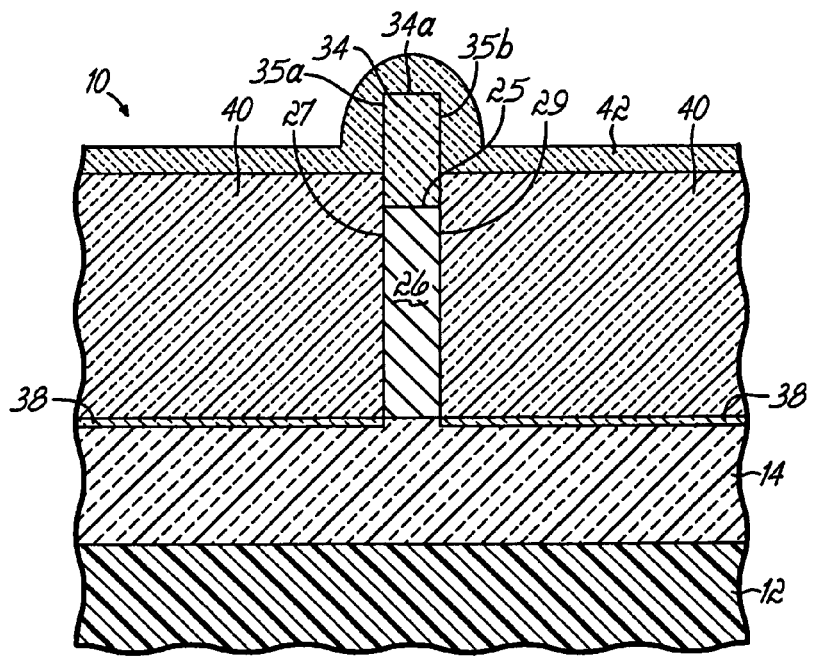

With reference to FIGS. 5A,B in which like reference numerals refer to like features in FIGS. 4A,B and at a subsequent fabrication stage, a conformal layer 42 of a spacer material is then formed on semiconductor wafer 10 over the upper surface of the dielectric layer 40. The conformal layer 42 also covers the upper surface 34a and exposed portion of the sidewalls 35a,b of the cap 34, which are positioned above the horizontal plane of the upper surface of the dielectric layer 40. The conformal layer 42 may be silicon nitride deposited by a CVD process and having a thickness ranging from about 10 nm to about 100 nm.

Figure 6A:
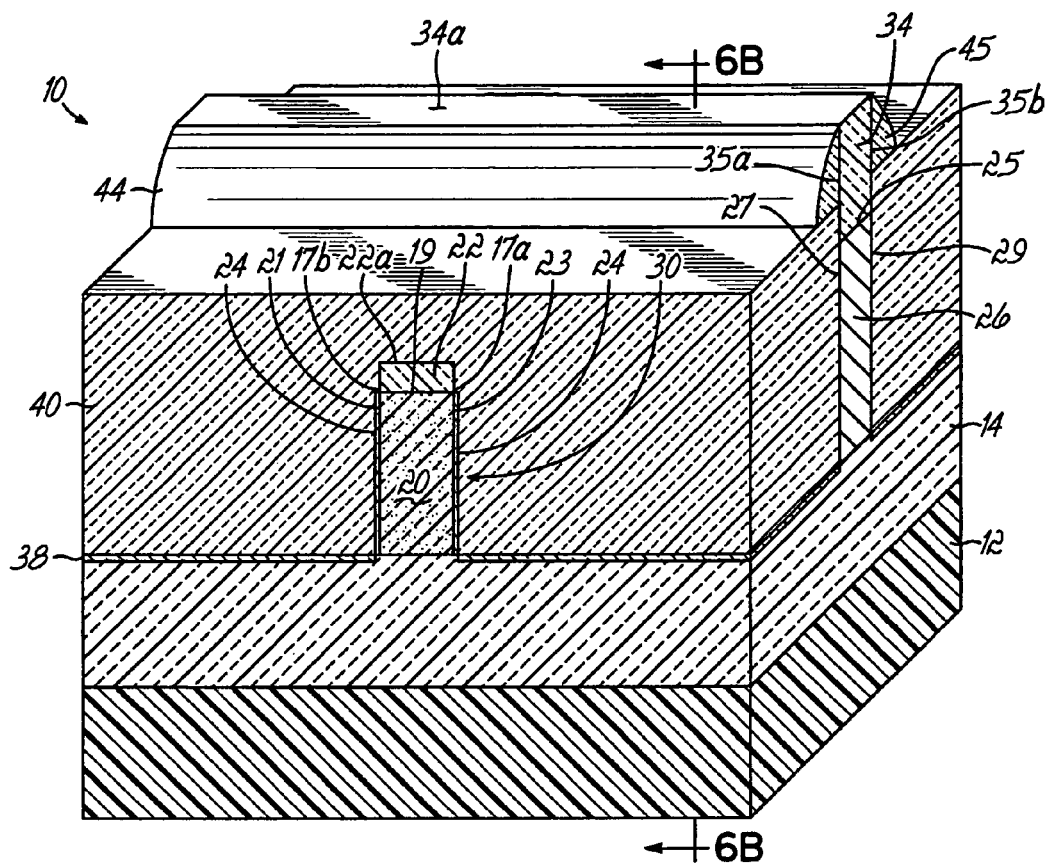

With reference to FIGS. 6A,B in which like reference numerals refer to like features in FIGS. 5A,B and at a subsequent fabrication stage, cap spacers 44, 45 are formed from the conformal layer 42 and flank the exposed portion of the sidewalls 35a,b of cap 34. Cap spacers 44, 45 will have the composition of the conformal layer 42 and may be, for example, composed of nitride if conformal layer 42 is nitride. Cap spacers 44, 45 may be defined by an anisotropic etching process, such as RIE or plasma etching, that removes the material of the conformal layer 42 selective (i.e., with a significantly greater etch rate) to the constituent material of the dielectric layer 40. For example, if the cap 34 is nitride, the etching process forming cap spacers 44, 45 may be a nitride RIE that removes nitride selective to oxide in dielectric layer 40.

Figure 7A:
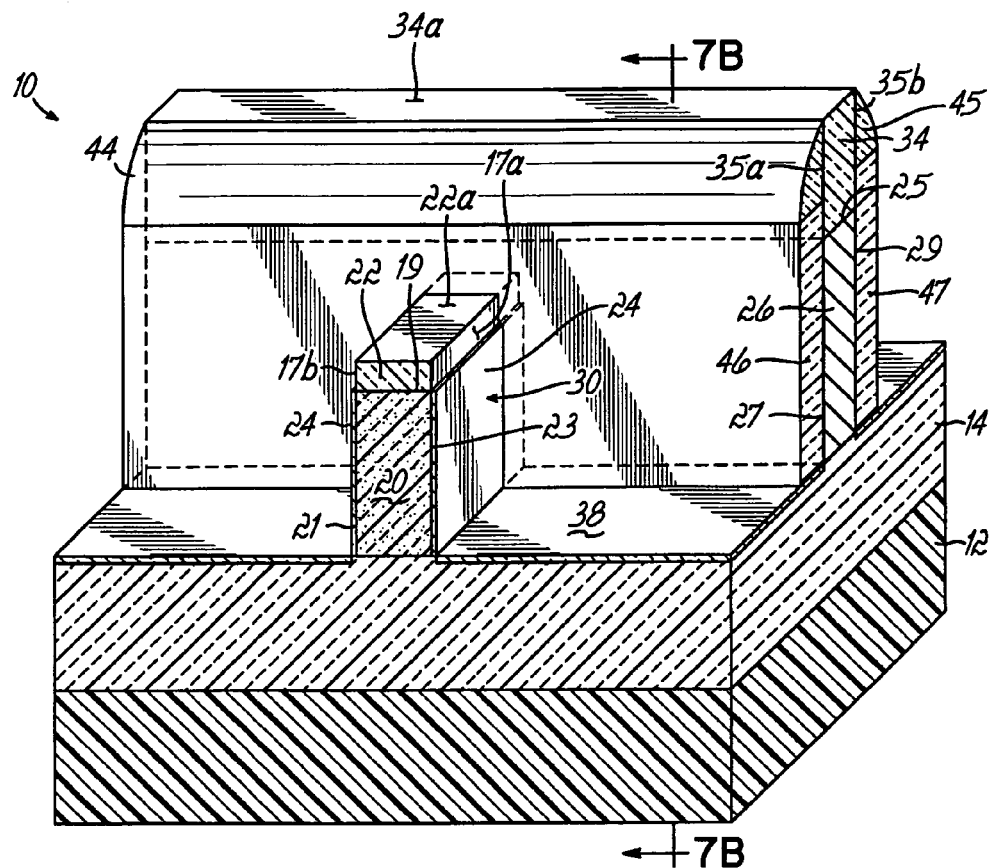
Figure 7B:
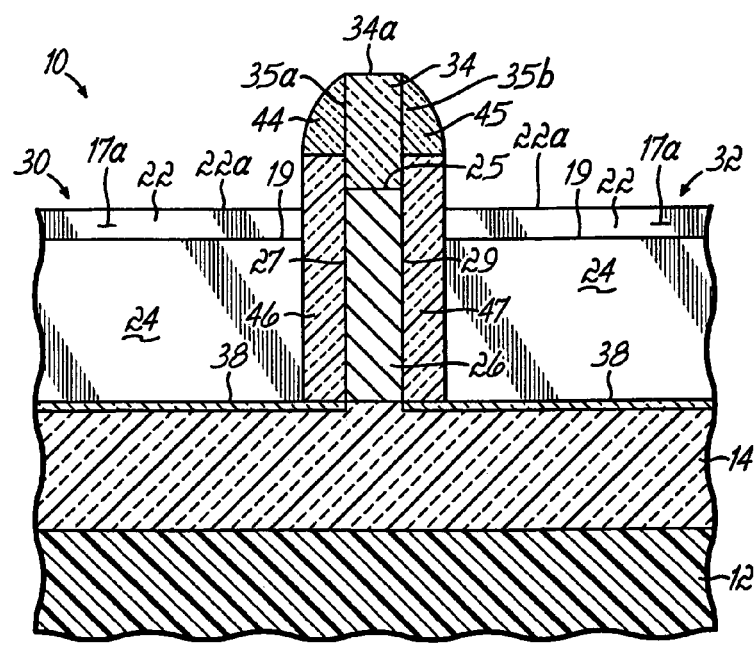

With reference to FIGS. 7A,B in which like reference numerals refer to like features in FIGS. 6A,B and at a subsequent fabrication stage, the dielectric layer 40 is anisotropically etched by an RIE process or another etching process that removes the material constituting dielectric layer 40 selective to the constituent material of the cap 34 and the constituent material of cap spacers 44, 45. The anisotropic etching process directionally removes unmasked portions of the dielectric layer 40 on horizontal surfaces, such as the buried dielectric layer 14, and stops vertically on an upper surface of the modified region 38 of the buried dielectric layer 14. The modified region 38 operates as an etch mask for the buried dielectric layer 14, which may be formed from a material with etch selectivity similar to dielectric layer 40.

The cap spacers 44, 45 that flank the sidewalls 35a,b of cap 34 operate as an etch mask for underlying portions of the dielectric layer 40. As a result, sidewall spacers 46, 47 that represent residual dielectric material from the etched dielectric layer 40 are formed on the sidewalls 27, 29 of the gate electrode 26. The end regions 30, 32 of the fin 20, which will be subsequently doped to define source/drain regions 48, 50 (FIGS. 8A,B), are exposed following the conclusion of this anisotropic etching process and free of the dielectric layer 40 as the dielectric layer 40 is removed with the exception of the regions vertically below the cap spacers 44, 45 flanking cap 34.

The upper surface 34a of the cap 34 on the gate electrode 26 is vertically above the upper surface 22a of the cap 22 on fin 20. As a consequence, cap spacers 44, 45 may be applied that flank the sidewalls 35a,b of cap 34 on the gate electrode 26 without forming spacers that flank sidewalls 17a,b of the cap 22 on the fin 20. Dielectric layer 40, which is recessed to partially reveal cap 34 on gate electrode 26, masks the fin 20 and cap 22 during the process forming cap spacers 44, 45.

Figure 8A:
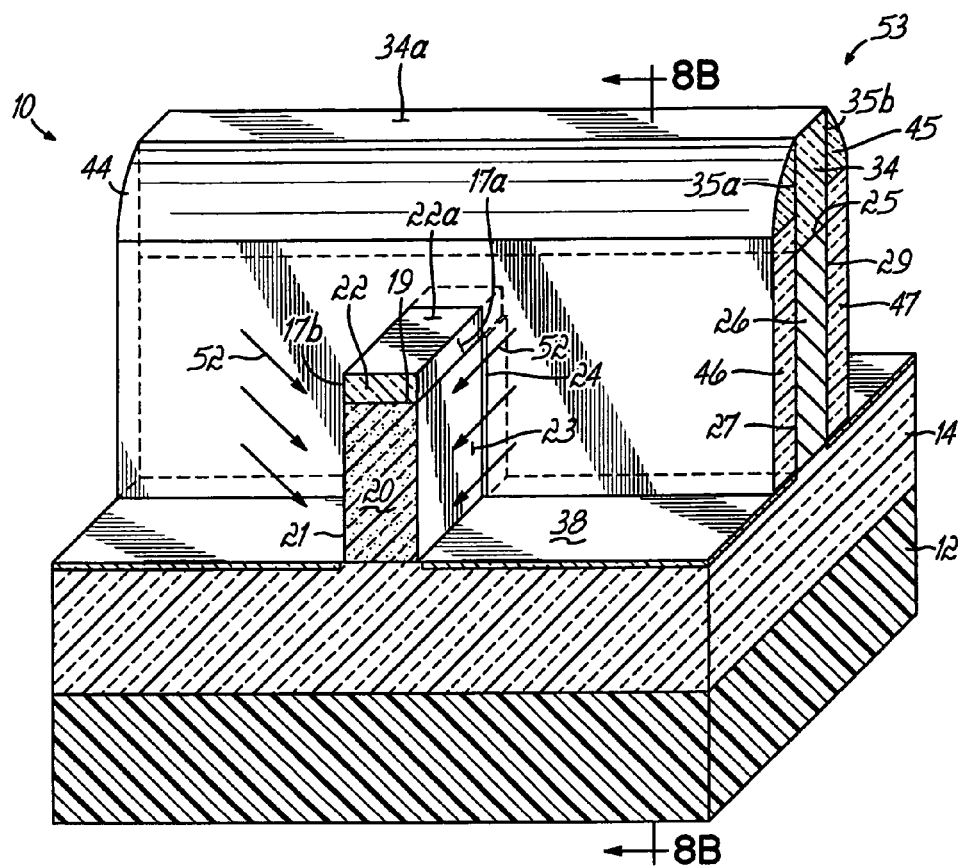
Figure 8B:
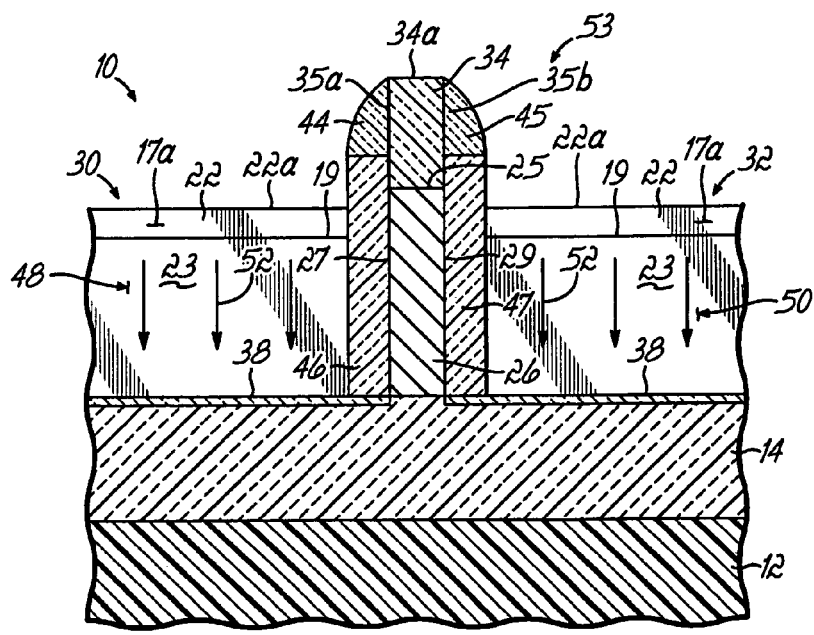

With reference to FIGS. 8A,B in which like reference numerals refer to like features in FIGS. 7A,B and at a subsequent fabrication stage that completes the basic semiconductor structure characteristic of a FinFET 53, the gate dielectric 24 is stripped from the exposed sidewalls 21, 23 along end regions 30, 32 of the fin 20 by an isotropic etch that removes the material constituting the gate dielectric 24 selective to the material constituting the fin 20. A person having ordinary skill in the art will appreciate that the gate dielectric 24 along end regions 30, 32 may be removed by the etching process removing the unmasked regions of dielectric layer 40 during the previous fabrication stage.

The source/drain regions 48, 50, which flank the channel region 28, are then formed by, for example, a conventional off-axis or angled ion implantation technique that introduces ions 52 of a suitable n-type or p-type dopant and with a suitable dose and low kinetic energy into the sidewalls 21, 23 of fin 20 along end regions 30, 32. The shallow implantation is conducted with the ions 52 incident at angles other than 90° relative to the top surface of fin 20. The wafer 10 may be thermal treated to disperse the implanted depth profile of the dopant through the fin 20 and to activate the dopant while annealing any implantation damage. Alternatively, the source/drain regions 48, 50 may be formed by dopant diffusion, solid source diffusion, or by a combination of either technique with angled ion implantation. The gate electrode 26, cap 34, cap spacers 44, 45, and sidewall spacers 46, 47 operate as a self-aligned protective sheath or mask for the dopant concentration, such as the resultant dopant concentration from ions 52, that is introduced into the end regions 30, 32 of fin 20 to form the source/drain regions 48, 50. This mask inhibits the introduction of the dopant into the gate electrode 26 and, advantageously, may prohibit dopant introduction into the gate electrode 26 from the process forming the source/drain regions 48, 50.

Processing would continue to complete the semiconductor structure, including forming contacts to the gate electrode 26 and the source/drain regions 48, 50 of all FinFET 53 on the semiconductor wafer 10. All of these contacts can be formed using any suitable technique, such as a damascene process where an insulator is deposited, patterned to open vias, and then the vias are filled with a suitable conductive material, as understood by a person having ordinary skill in the art. After forming the contacts, the FinFET's 53 and other devices on the semiconductor wafer 10 and peripheral devices may be completed using any suitable back-end-of-line processing and packaging.

In accordance with an alternative embodiment of the present invention and described below with regard to FIGS. 9A,B-13A,B, the encapsulated gate electrode 26 of the FinFET 53 (FIGS. 13A,B) may have a bilayer arrangement of sidewall spacers. Specifically, the sidewalls 27, 29 of the gate electrode 26 may be covered by sidewall spacers 60, 61 (FIGS. 12A,B) and a second set of sidewall spacers 60a, 61a (FIGS. 12A,B), which may be formed from a different material than the material forming spacers 60, 61 and which are positioned between the gate electrode 26 and the spacers 60, 61.

Figure 9A:
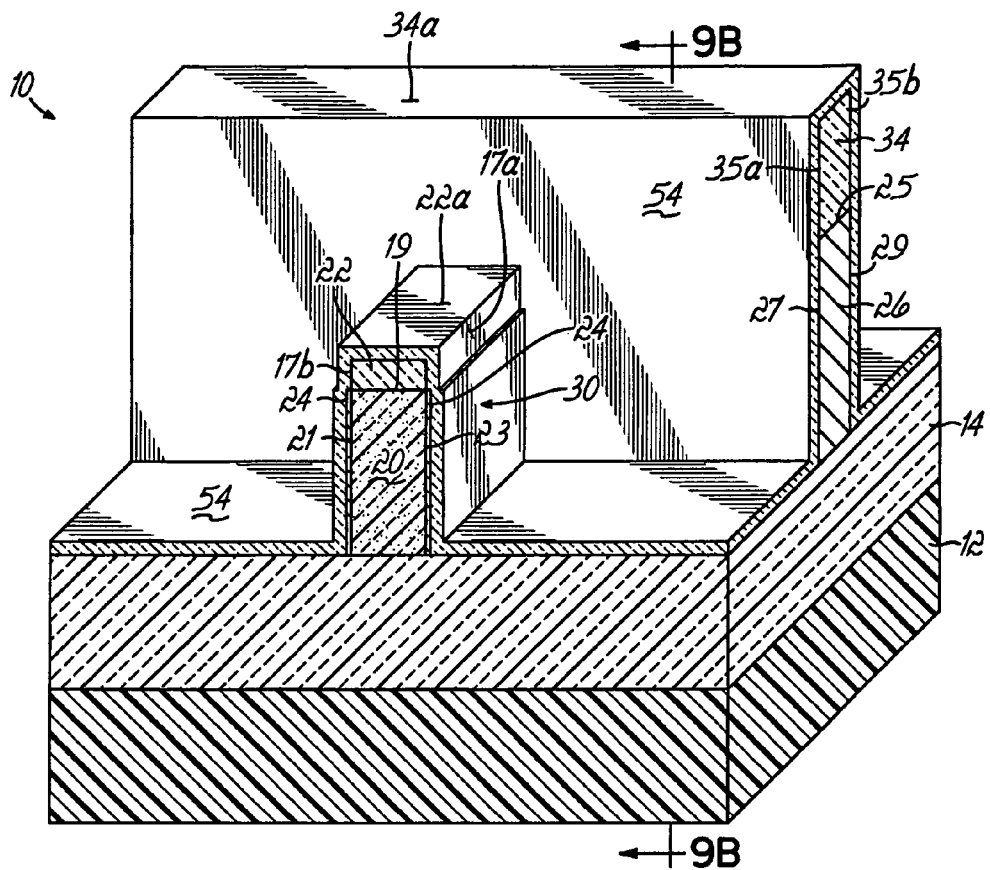
FIGS. 9-13 are diagrammatic views of a portion of a substrate at various fabrication stages of a processing method in accordance with an alternative embodiment of the present invention wherein A represents an isometric view and B is a corresponding cross-sectional view taken generally along lines B-B in A.
Figure 9B:
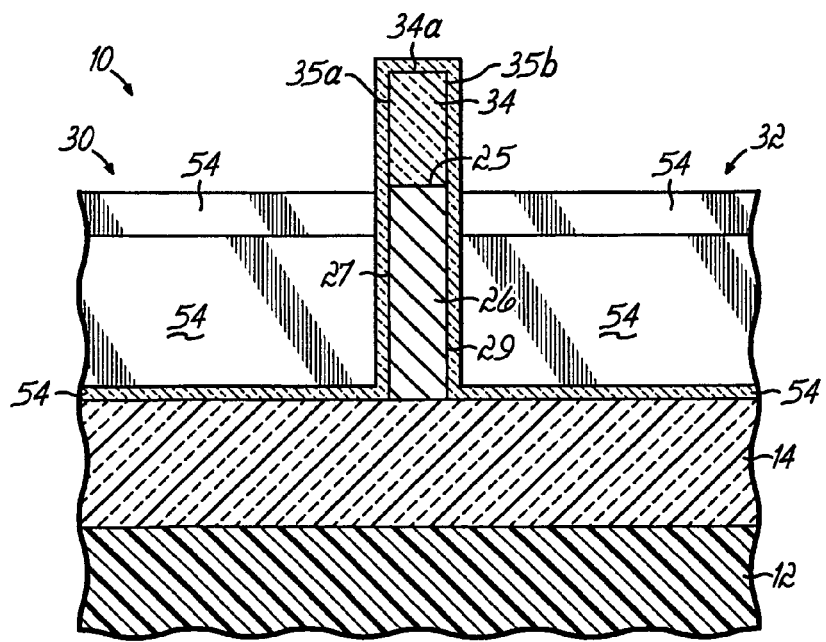

With reference to FIGS. 9A,B in which like reference numerals refer to like features in FIGS. 2A,B and at a subsequent fabrication stage in accordance with an alternative embodiment of the present invention, an etch stop layer 54 is formed conformally across the surface of the semiconductor wafer 10. Etch stop layer 54 may consist of, for example, silicon nitride deposited by a suitable CVD process. The thickness of the etch stop layer 54, if composed of nitride, may range from about 5 nm to about 40 nm. The etch stop layer 54 eliminates the need for the fabrication stage (FIGS. 3A,B) that ion implants the exposed surface of the buried dielectric layer 14. The etch stop layer 54 increases the effective thickness and width of caps 22, 34.

Figure 10A:
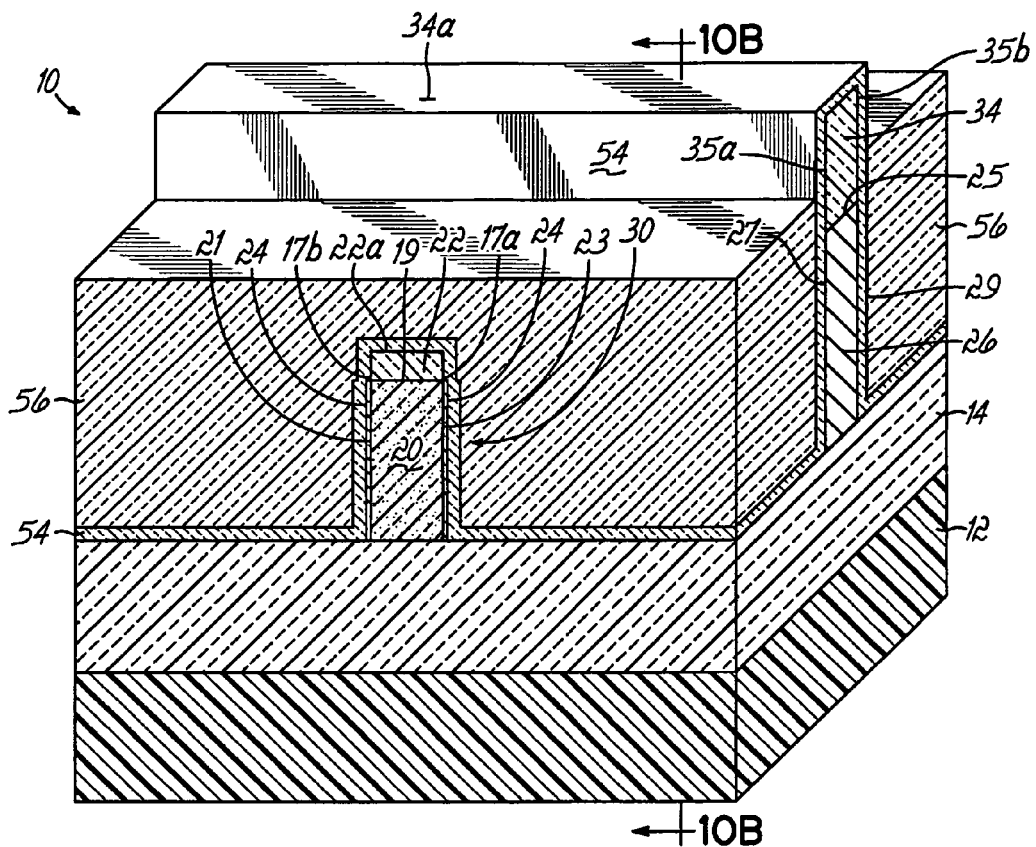
Figure 10B:
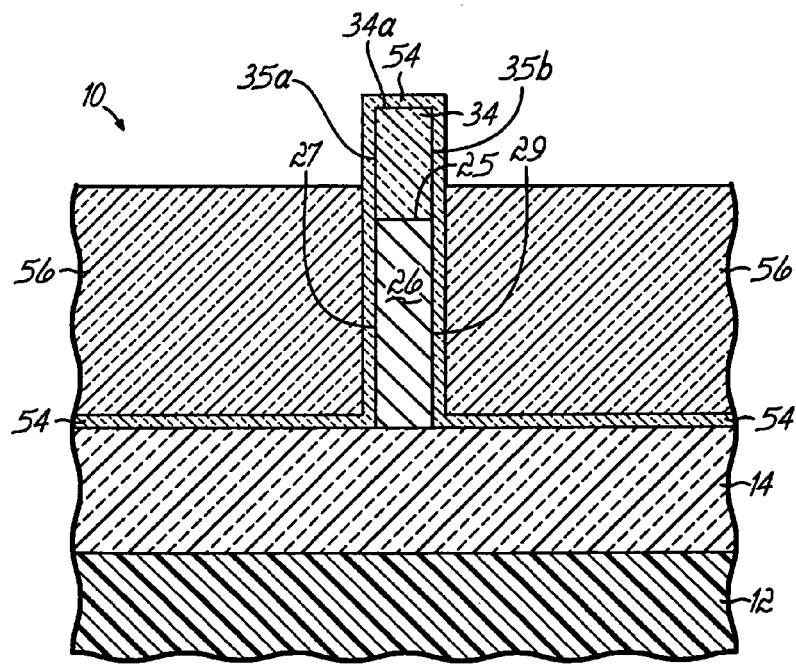

With reference to FIGS. 10A,B in which like reference numerals refer to like features in FIGS. 9A,B and at a subsequent fabrication stage, a layer 56 of a dielectric material, such as a soft CVD oxide like undensified TEOS, is deposited on semiconductor wafer 10 with a thickness that covers the top surface of the cap 34 over the gate electrode 26. The dielectric layer 56 is then planarized with a conventional planarization process, like a CMP process that removes excess dielectric material, to the top surface of the cap 34. The dielectric layer 56 is then recessed vertically by an anisotropic etch that removes the constituent material of the dielectric layer 56 selective to the material forming the cap 34. Typically, the dielectric layer 56 is recessed vertically to a depth relative to the interface of cap 34 with upper surface 25 of gate conductor 26 that uncovers the majority (i.e., between one-half to three-quarters) of the vertical sidewalls 35a,b of cap 34, which are covered by the thickness of the etch stop layer 54.

Figure 11A:
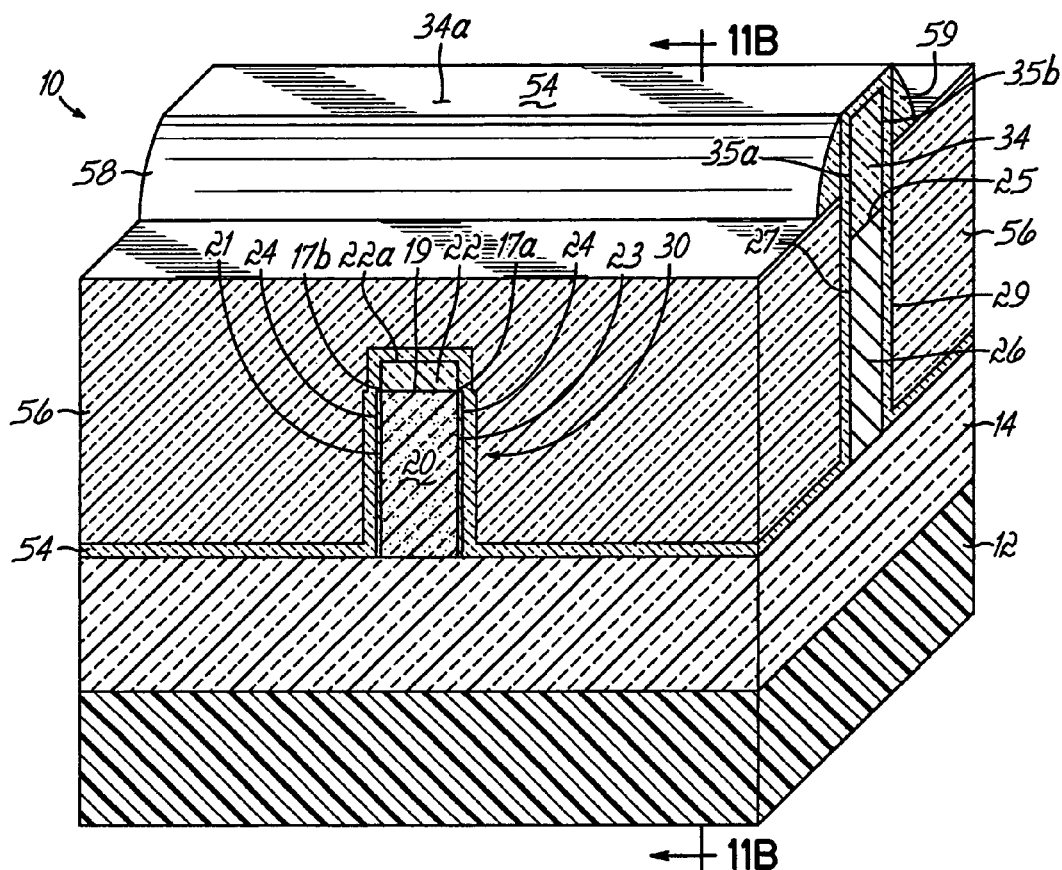
Figure 11B:
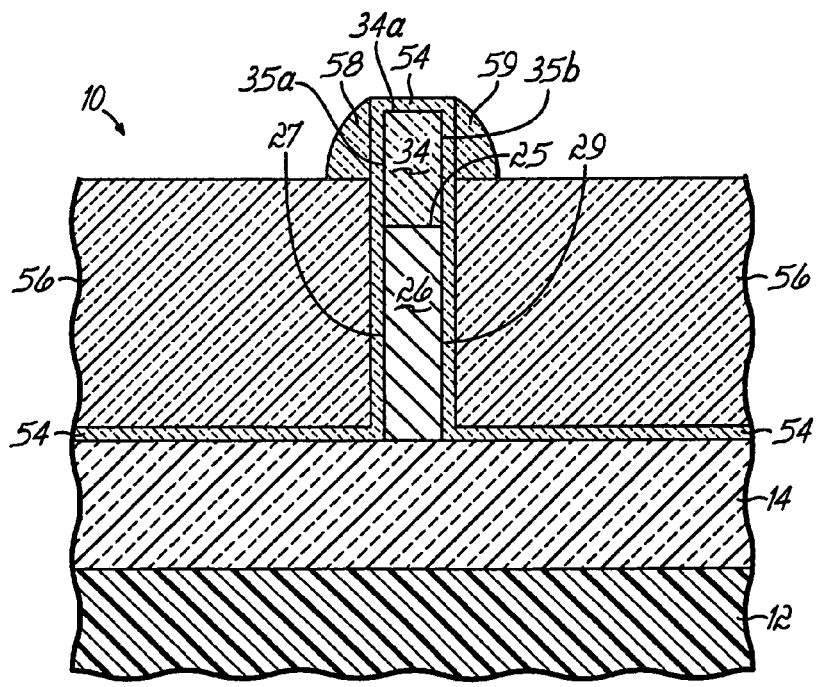

With reference to FIGS. 11A,B in which like reference numerals refer to like features in FIGS. 10A,B and at a subsequent fabrication stage, cap spacers 58, 59 are formed flanking the sidewalls 35a,b of the exposed portion of the cap 34. More specifically, cap spacers 58, 59 are formed by depositing a conformal layer (not shown) of an appropriate spacer material, such as nitride, with a thickness ranging from about 10 nm to about 100 nm and anisotropically etching with an etching process, such as RIE or plasma etching, that removes the material of this conformal layer selective to the constituent material of the dielectric layer 56. For example, the etching process may be a nitride RIE, selective to oxide in dielectric layer 56, that forms cap spacers 58, 59 of nitride on the exposed sidewalls of the cap 34.

Figure 12A:
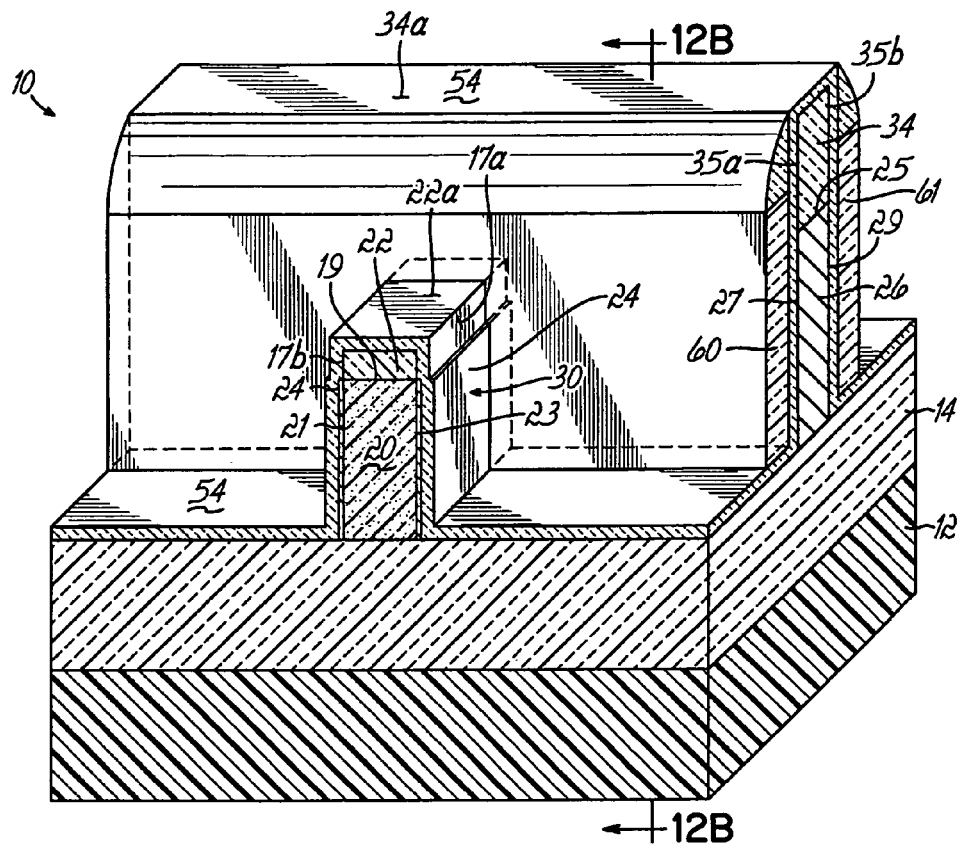
Figure 12B:
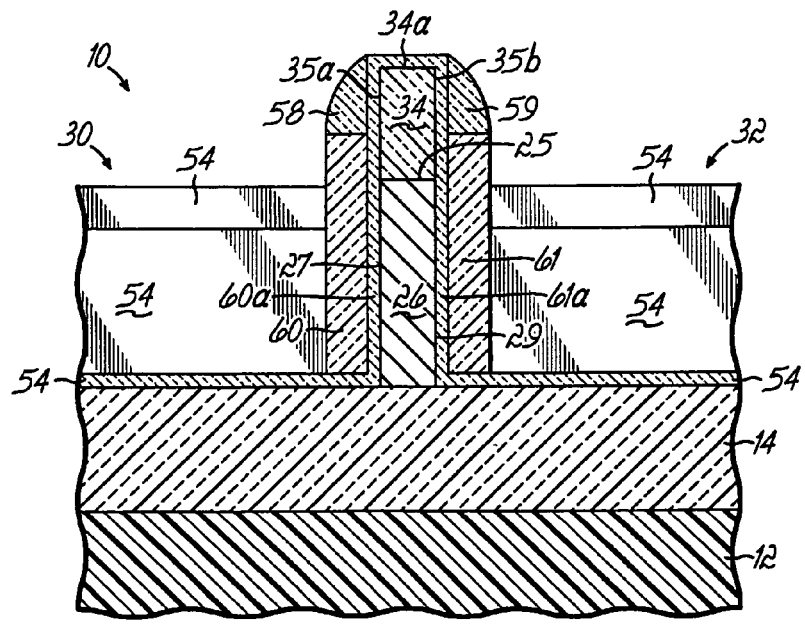

With reference to FIGS. 12A,B in which like reference numerals refer to like features in FIGS. 11A,B and at a subsequent fabrication stage, the dielectric layer 56 is anisotropically etched by, for example, an RIE or plasma process, that removes the constituent material of the dielectric layer 56 selective to the material constituting the cap 34 and the material constituting cap spacers 58, 59. The anisotropic etching process stops vertically on the etch stop layer 54 and leaves sidewall spacers 60, 61 of a dielectric material, such as oxide, on the sidewalls 27, 29 of the gate electrode 26. The cap spacers 58, 59 on cap 34 operate as an etch mask for the dielectric layer 56.

The constituent material of the dielectric layer 56 is removed completely from the sidewalls 21, 23 of the fin 20, which will be doped during a subsequent fabrication stage to define source/drain regions 48, 50 (FIGS. 8A,B) that flank the channel region 28. Accordingly, the prospective source/drain regions 48, 50 are protected during subsequent fabrication stages by the remaining portions of the etch stop layer 54. Similarly, the portions of the etch stop layer 54 remaining on the sidewalls 27, 29 of the gate electrode 26 constitute additional sidewall spacers 60a, 61a that are covered during subsequent fabrication stages by the sidewall spacers 60, 61. Sidewall spacers 60a, 61a, which are formed from a different material than the material forming sidewall spacers 60, 61, may be beneficial, for example, during high temperature processing by further limiting dopant diffusion through the bi-layer structure. For example, the sidewall spacers 60, 61 may be oxide and the sidewall spacers 60a, 61a may be nitride.

Figure 13A:
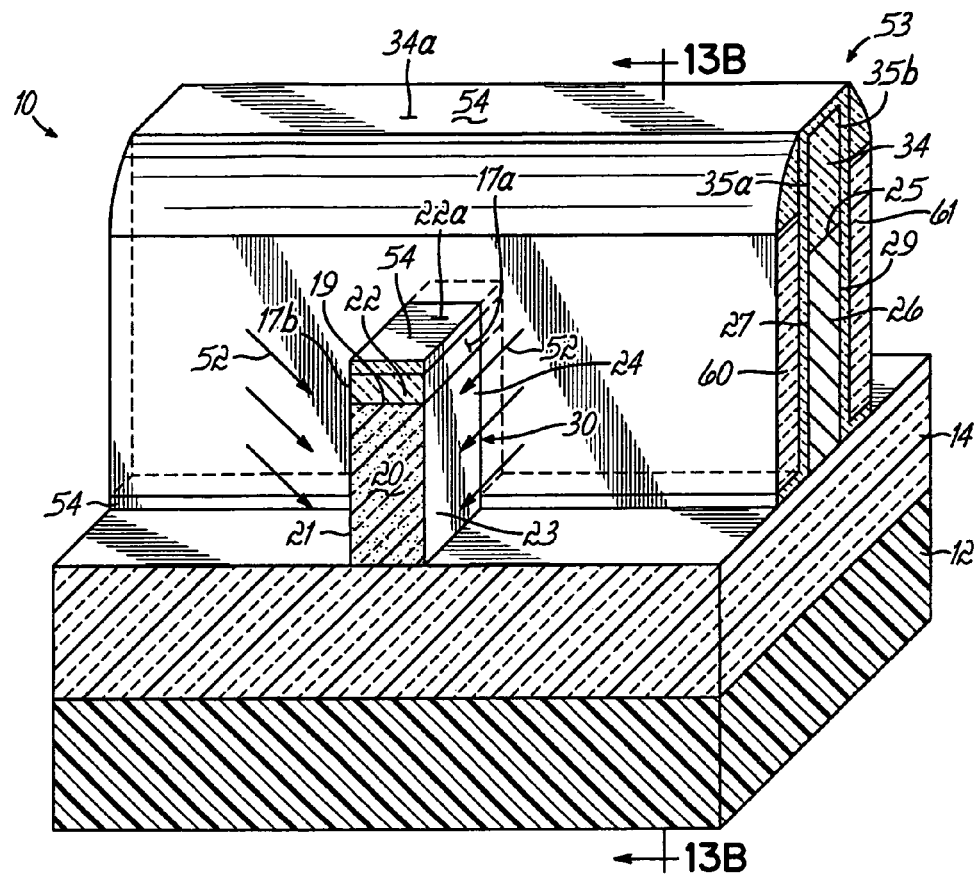
Figure 13B:
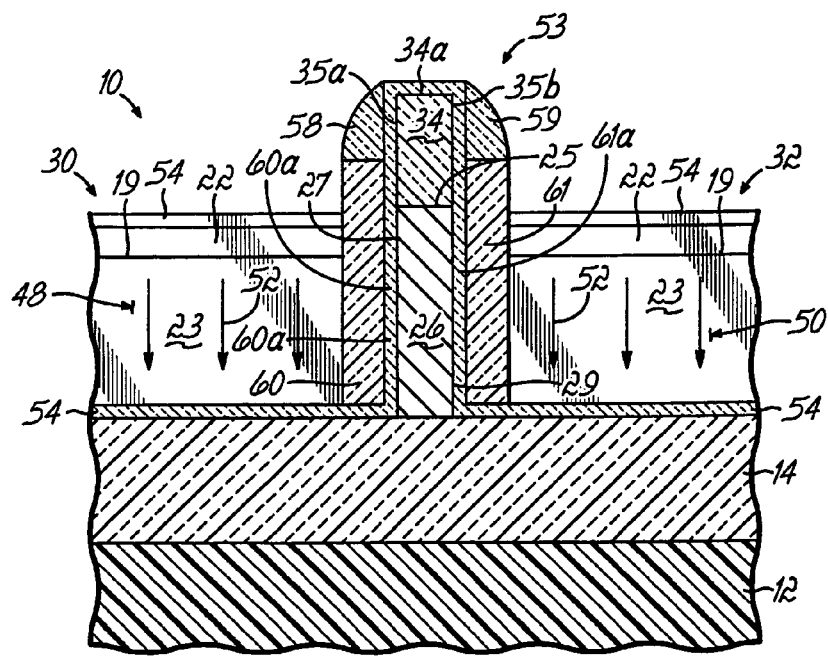

With reference to FIGS. 13A,B in which like reference numerals refer to like features in FIGS. 12A,B and at a subsequent fabrication stage that completes the basic semiconductor structure characteristic of the FinFET 53, the residual etch stop layer 54 is removed from the sidewalls of the fin 20 by a dry or wet isotropic etching process that, for example, removes nitride selective to oxide. The isotropic etching process may thin the cap spacers 58, 59 flanking the cap 34 on the gate electrode 26, which are sacrificial, and the cap 34. However, the etch stop layer 54 may be considerably thinner than the cap 34 so that layer 54 is removed with a negligible impact on the thickness of cap 34.

The gate dielectric 24 is stripped from the exposed sidewalls 27, 29 of the fin 20 along end regions 30, 32 by an isotropic etch that removes the material constituting the gate dielectric 24 selective to the constituent material of the fin 20. Because the gate dielectric 24 is considerably thinner than the sidewall spacers 60, 61, any sacrificial removal of sidewall spacers 60, 61 from the sidewalls 27, 29 of gate electrode 26 is negligible, even if the sidewall spacers 60, 61 and gate dielectric 24 are formed from the same material (e.g., oxide). The source/drain regions 48, 50 are then doped by, for example, a conventional angled ion implantation technique that introduces ions 52 of a suitable n-type or p-type dopant and with a suitable dose and low kinetic energy into the sidewalls 21, 23 of fin 20 along end regions 30, 32, as described above in conjunction with FIGS. 8A,B. The mask supplied by sidewall spacers 60, 61, sidewall spacers 60a, 61a, and the cap 34 inhibits the introduction of the dopant into the gate electrode 26 and, advantageously, may prohibit dopant introduction into the gate electrode 26 from the process forming the source/drain regions 48, 50.

In accordance with an alternative embodiment of the present invention and as described below with regard to FIGS. 14A,B-24A,B, a damascene process may be used to form the encapsulated gate electrode 26 of the FinFET 53 (FIGS. 24A,B) after the fin 20 is formed. The sidewalls spacers 74, 75 (FIGS. 24A,B) are formed during the damascene process.

Figure 14A:
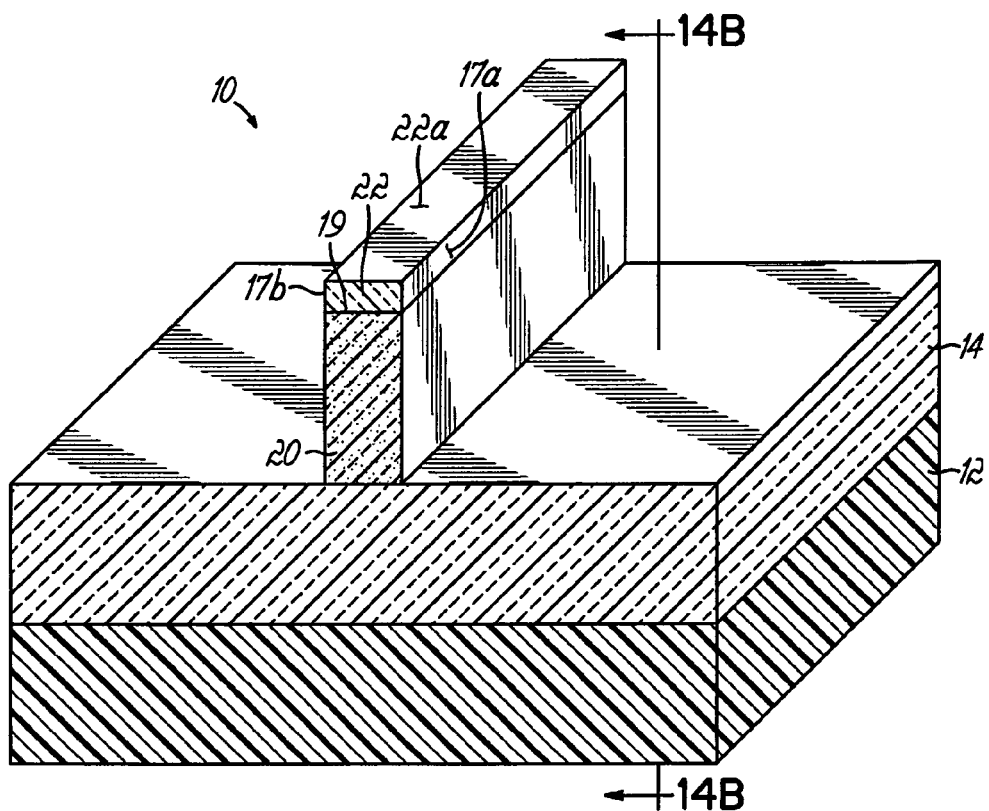
FIGS. 14-24 are diagrammatic views of a portion of a substrate at various fabrication stages of a processing method in accordance with another alternative embodiment of the present invention wherein A represents an isometric view and B is a corresponding cross-sectional view taken generally along lines B-B in A.
Figure 14B:
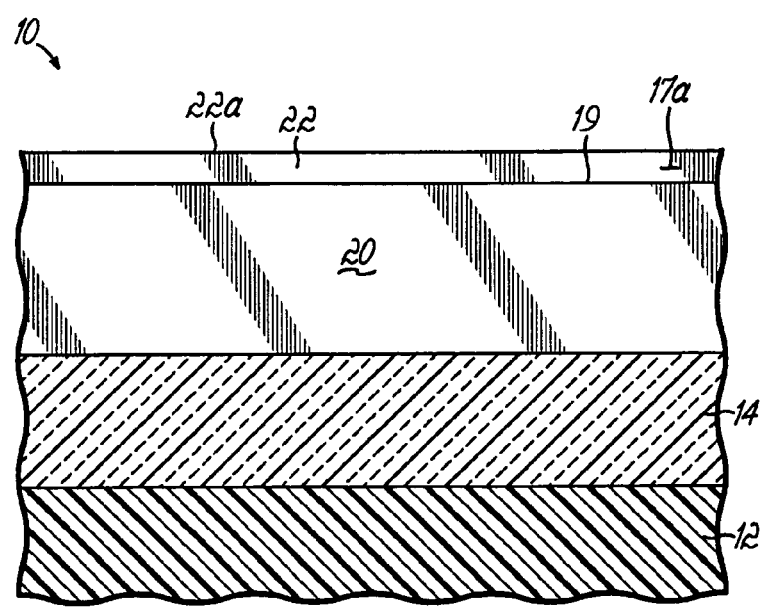

With reference to FIGS. 14A,B in which like reference numerals refer to like features in FIGS. 1A,B and at a subsequent fabrication stage in accordance with an alternative embodiment of the present invention, the semiconductor fin 20 is formed and capped by cap 22 as described above in conjunction with FIGS. 2A,B. However, the gate electrode 26 has not yet been formed.

Figure 15A:
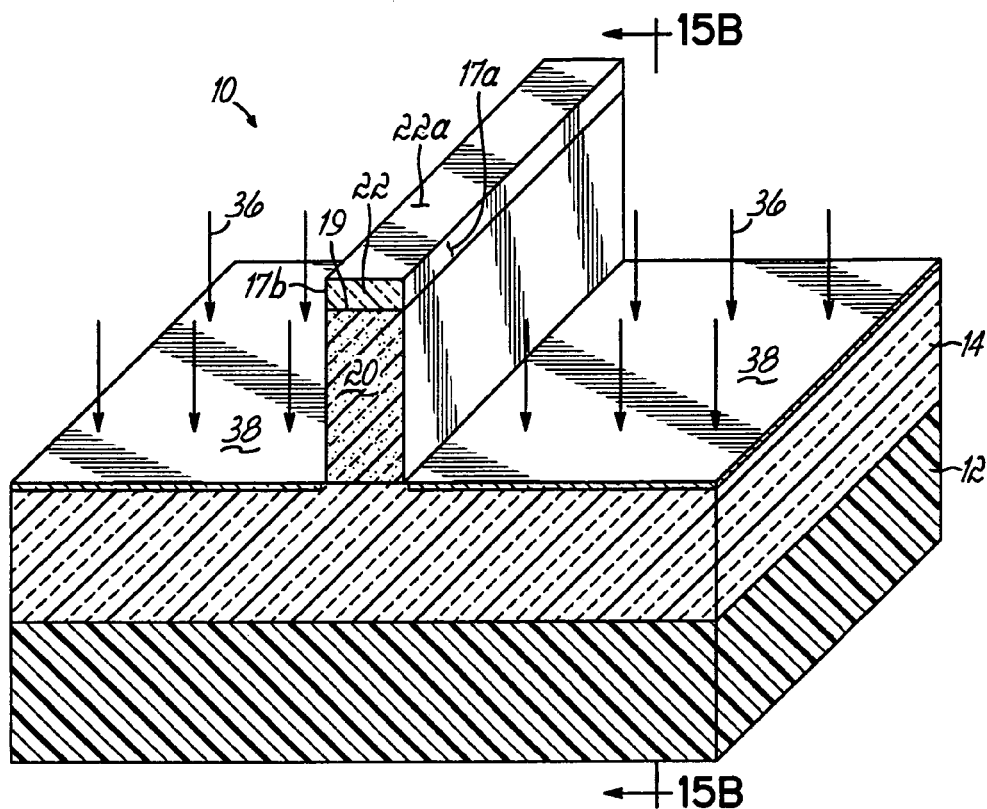
Figure 15B:
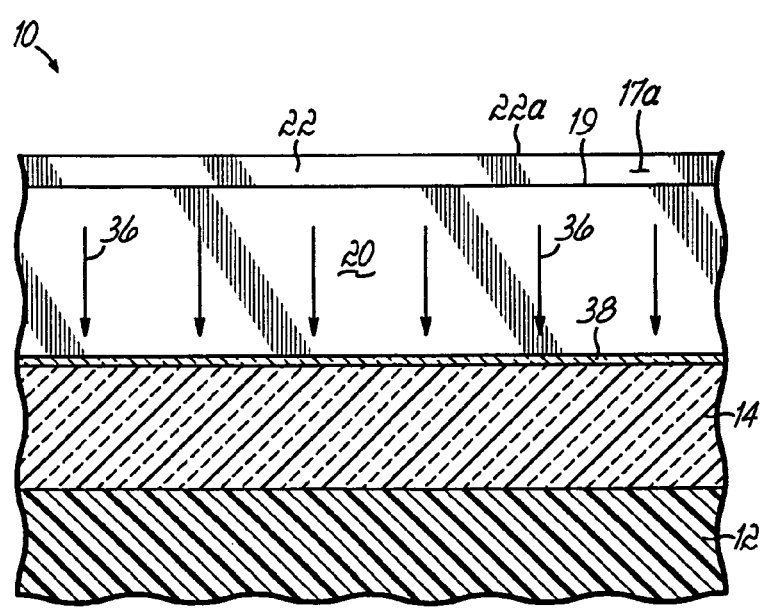

With reference to FIGS. 15A,B in which like reference numerals refer to like features in FIGS. 14A,B and at a subsequent fabrication stage, ions 36 are introduced into the buried dielectric layer 14 of semiconductor wafer 10 by an ion implantation process, as described above in conjunction with FIGS. 3A,B, to produce modified region 38. The cap 22 masks the fin 20 against receiving a significant dose of the implanted ions 36.

Figure 16A:
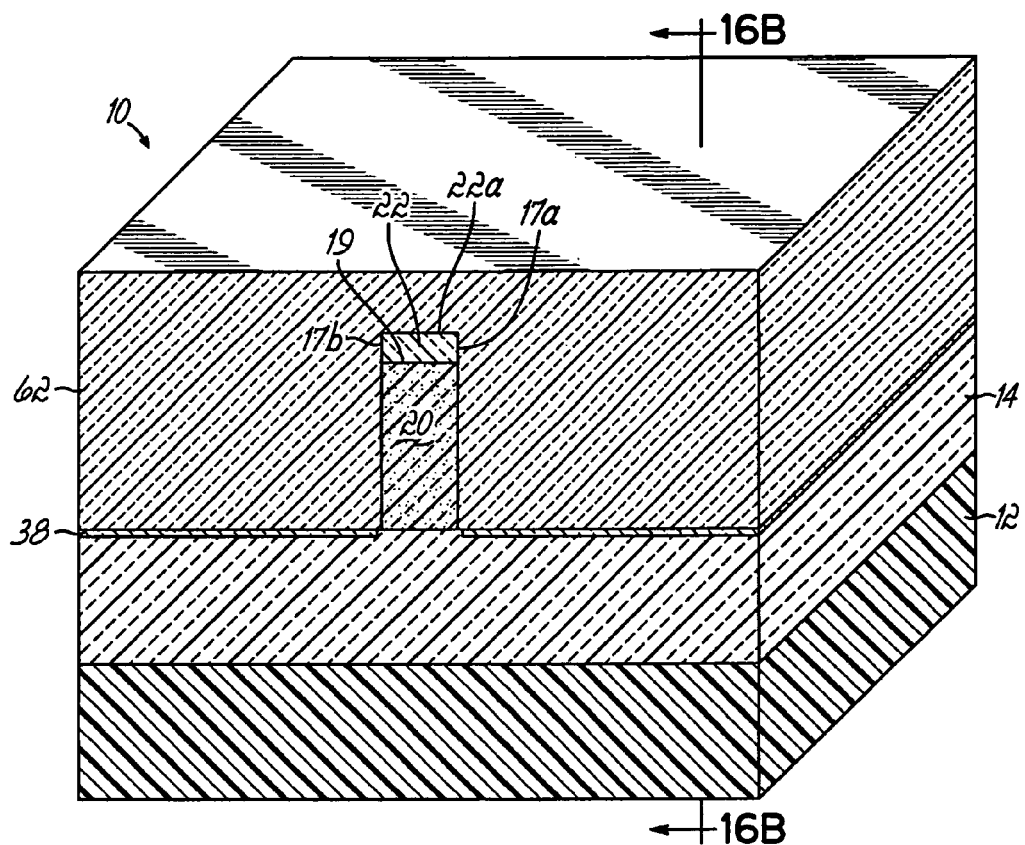
Figure 16B:
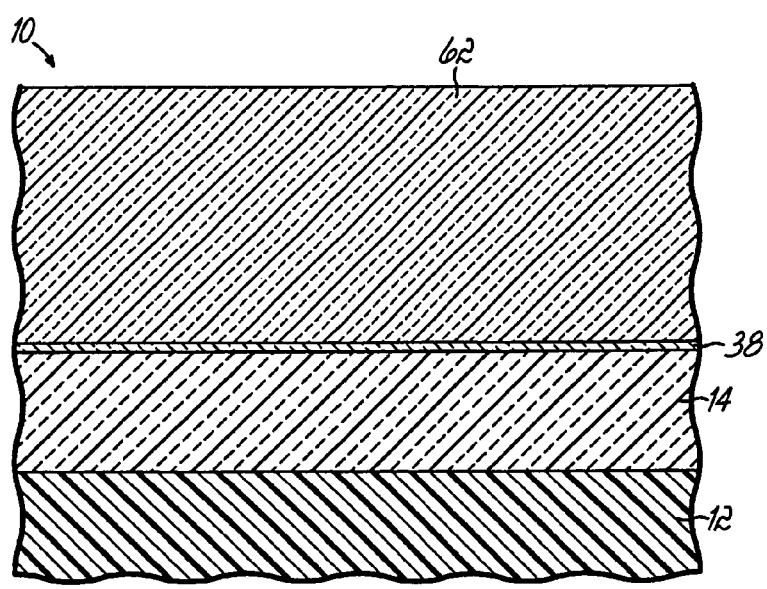

With reference to FIGS. 16A,B in which like reference numerals refer to like features in FIGS. 15A,B and at a subsequent fabrication stage, a layer 62 of a dielectric material, such as a soft CVD oxide like undensified TEOS, is deposited on semiconductor wafer 10 with a thickness that covers or buries the top surface of the cap 22 overlying each fin 20. The dielectric layer 62 is then planarized with a conventional planarization process, like a CMP process that removes excess dielectric material, to the top surface of the cap 22.

Figure 17A:
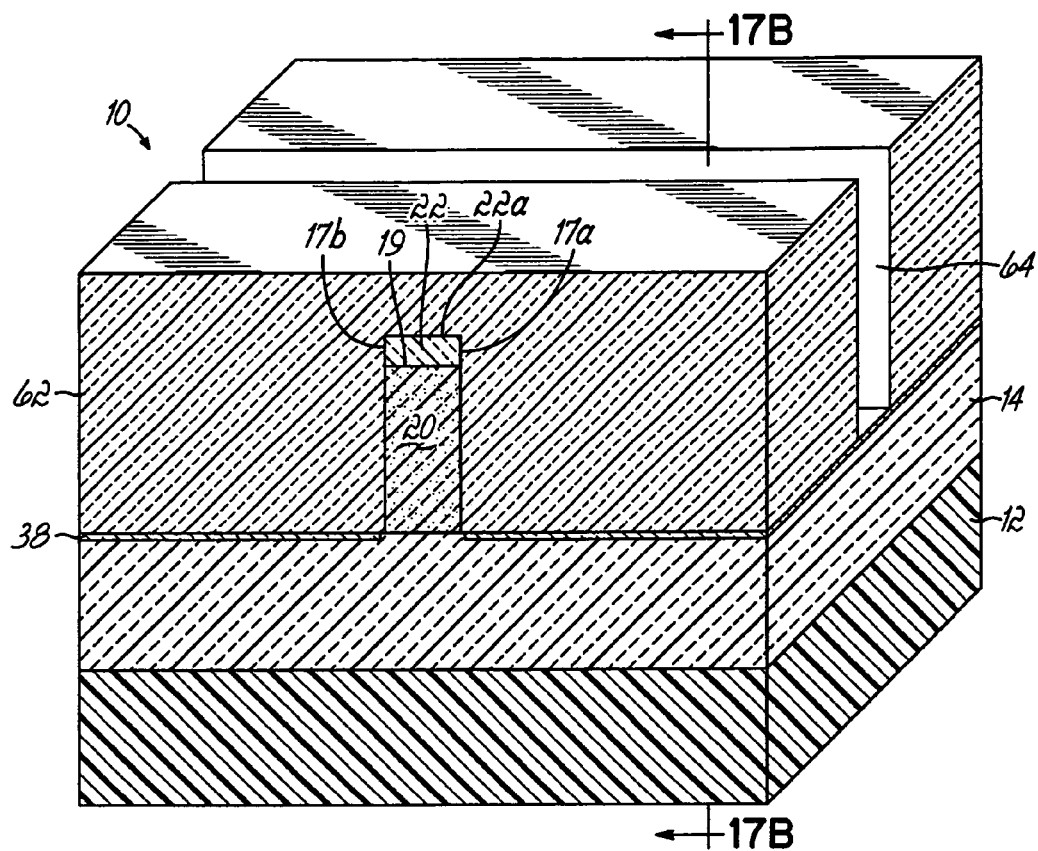
Figure 17B:
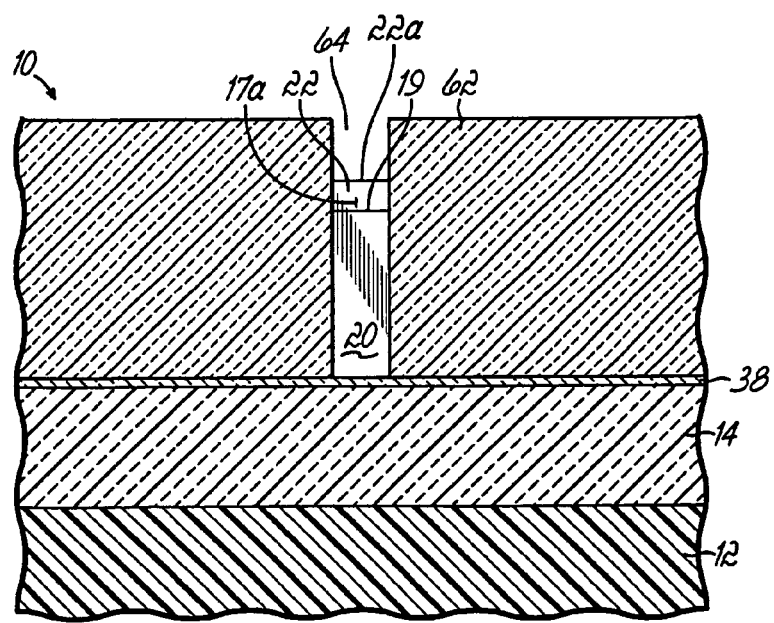

With reference to FIGS. 17A,B in which like reference numerals refer to like features in FIGS. 16A,B and at a subsequent fabrication stage, the dielectric layer 62 is patterned with a plurality of gate trenches, of which one gate trench 64 is visible in FIGS. 17A,B, by a conventional lithography and etching technique. For example, a resist layer (not shown) may be applied to dielectric layer 62, exposed to a pattern of radiation defined by a mask, and developed to define the transferred pattern in the exposed resist, and the developed pattern transferred to the dielectric layer 62 with a conventional anisotropic dry etching process, such as reactive-ion etching (RIE) or plasma etching, to define the gate trenches 64. The anisotropic dry etching process stops on the modified layer 38 and removes the material of the dielectric layer 62 (e.g., soft CVD oxide) selective to the material of the fin 20 (e.g., silicon) and the cap 22 (e.g., nitride). Each trench 64 is aligned with, and intersects, the channel region 28 of each fin 20 in a row or column of fins 20. Consequently, the sidewalls 21, 23 of fin 20 are exposed within the trench 64 across the channel region 28.

Figure 18A:
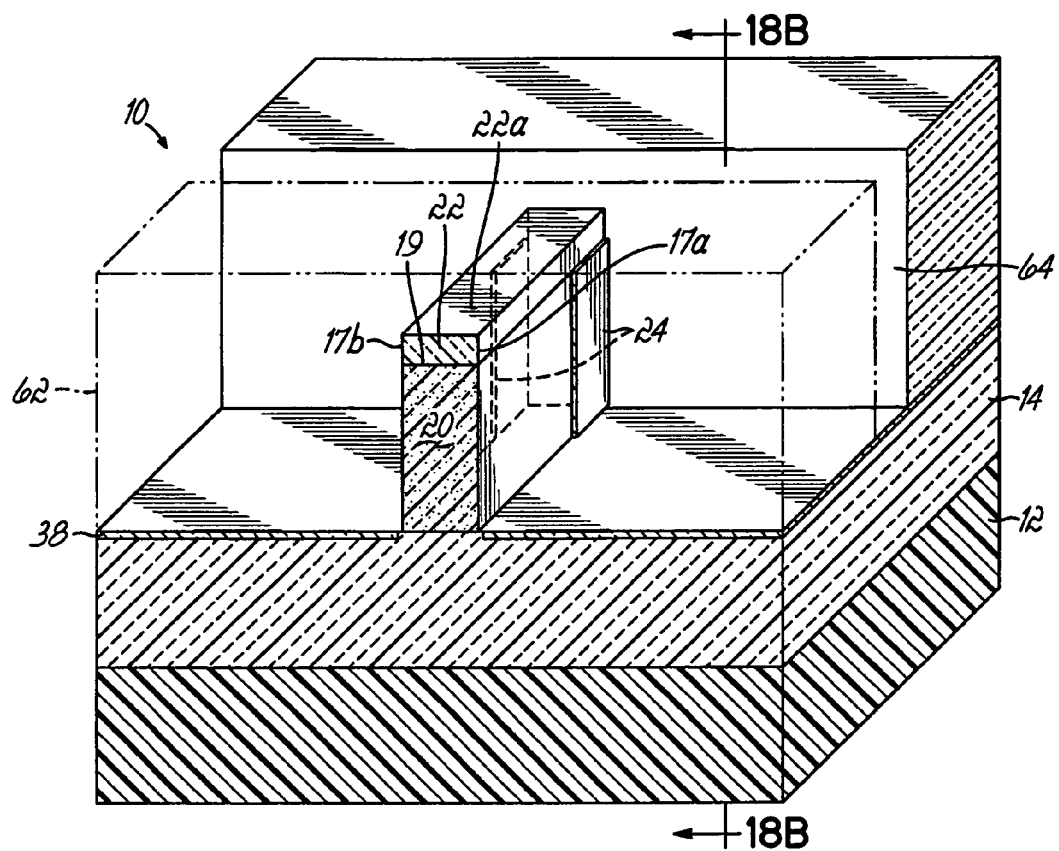
Figure 18B:
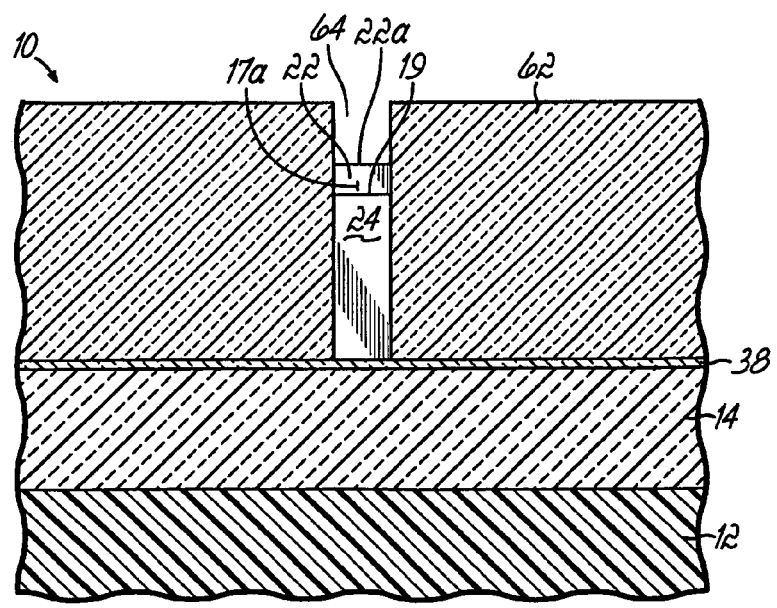

With reference to FIGS. 18A,B in which like reference numerals refer to like features in FIGS. 17A,B and at a subsequent fabrication stage, the gate dielectric 24 is formed, as described above in conjunction with FIGS. 2A,B, on the portions of the opposite sidewalls 21, 23 of the fin 20 exposed by the gate trench 64 and across the channel region 28. For purposes of clarity in illustration, a portion of the insulating layer 62 is shown in phantom in FIG. 18A.

Figure 19A:
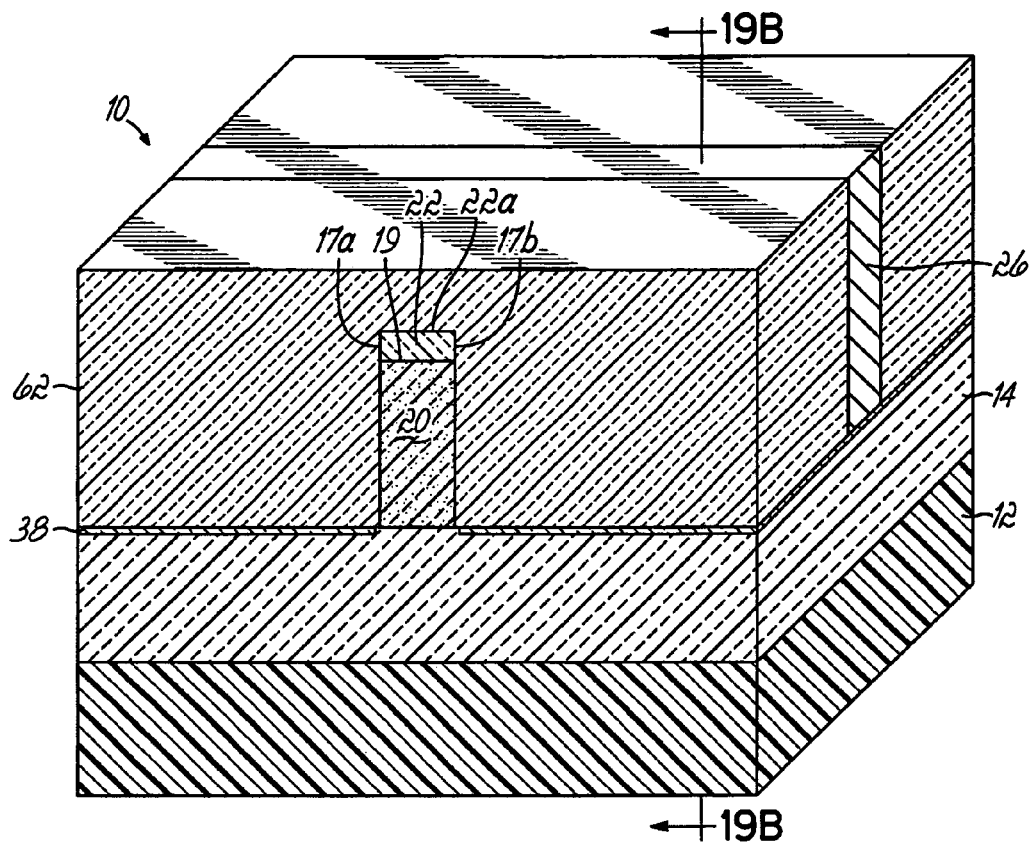
Figure 19B:
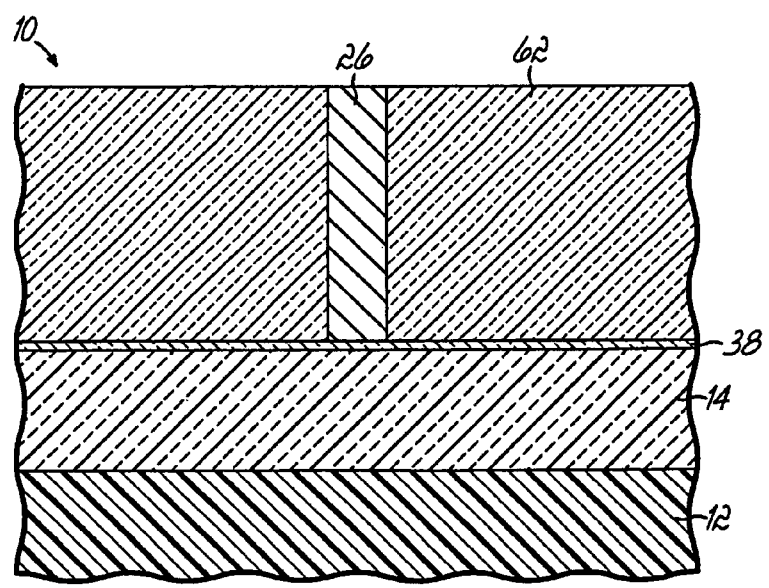
Figure 24A:
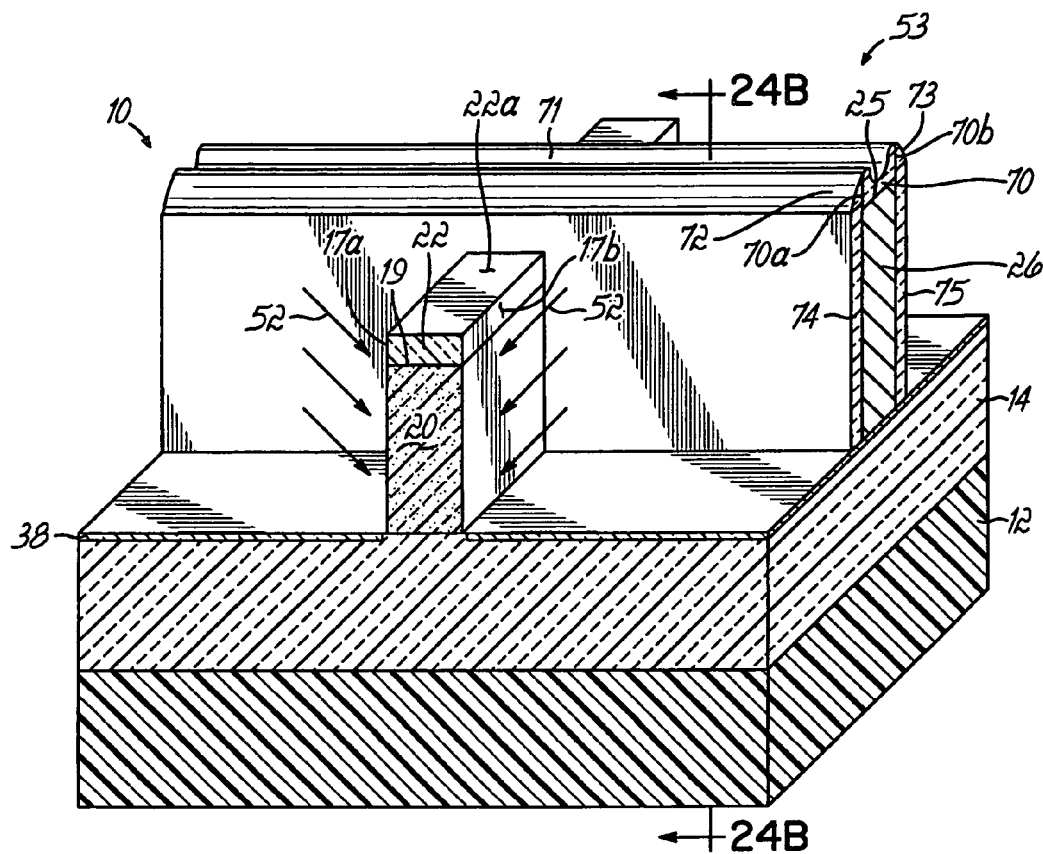
Figure 24B:
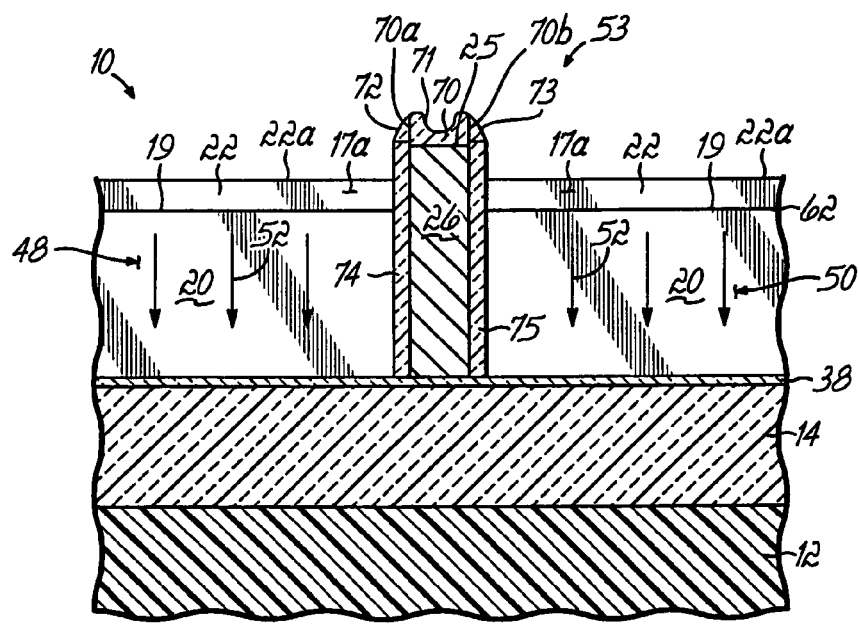

With reference to FIGS. 19A,B in which like reference numerals refer to like features in FIGS. 18A,B and at a subsequent fabrication stage, gate electrode 26 is formed across the channel region 28 by a damascene process. Specifically, a layer of a suitable conductor material is deposited that covers the dielectric layer 62 and fills each gate trench 64. The deposited conductor layer is planarized with a conventional planarization process, such as a CMP process, that removes excess conductor material on the dielectric layer 62 and stops vertically on dielectric layer 62. The gate electrode 26 may be composed of a refractory metal like tungsten or titanium, heavily doped polysilicon, a metal silicide like nickel silicide or tungsten silicide, or any combination of these materials. The material(s) selected for the gate electrode 26 establishes the work function and, consequently, influences the threshold voltage of the completed FinFET 53 (FIGS. 24A,B).

Figure 20A:
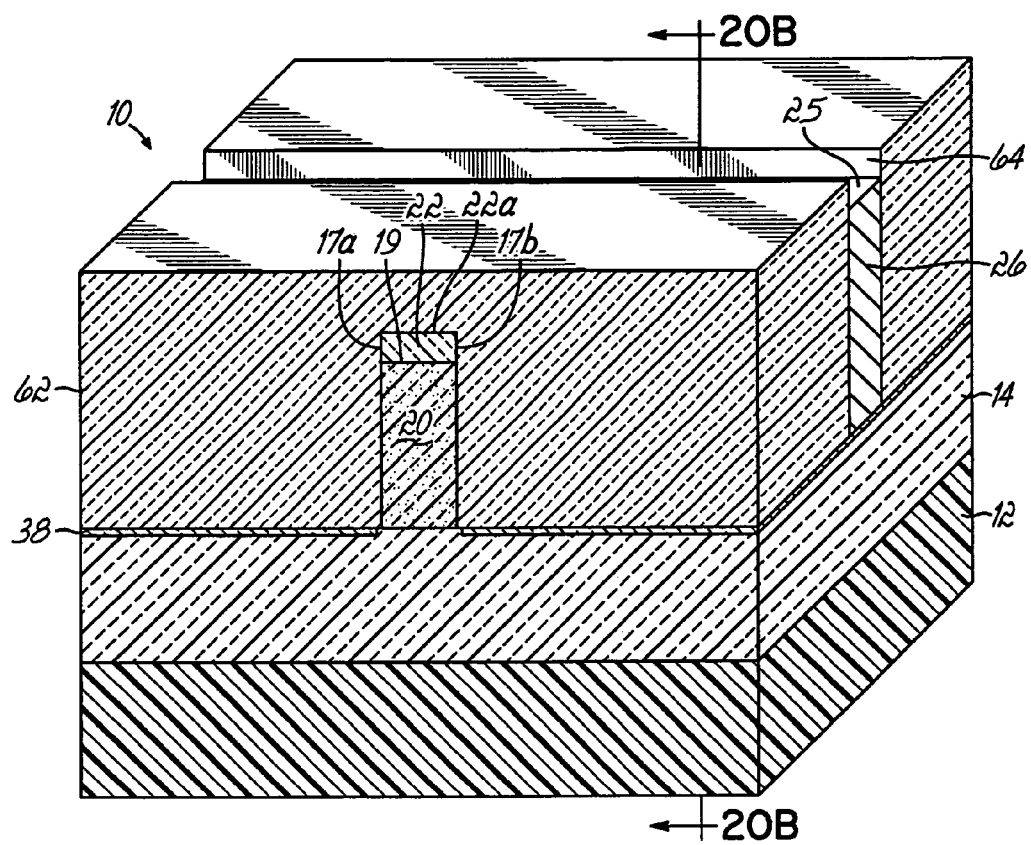
Figure 20B:
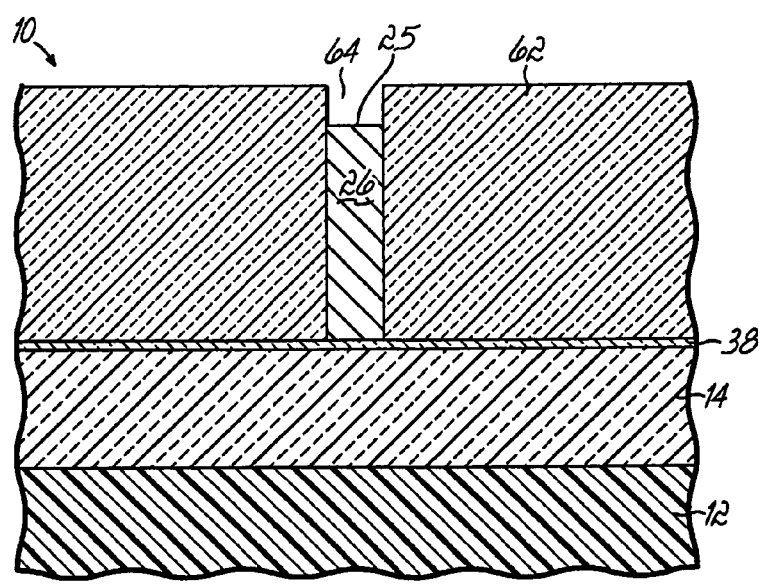

With reference to FIGS. 20A,B in which like reference numerals refer to like features in FIGS. 19A,B and at a subsequent fabrication stage, the upper surface of the gate electrode 26 is recessed within gate trench 64 below the horizontal level of the dielectric layer 62 by, for example, an anisotropic etching process that removes the material of the gate electrode 26 selective to the material constituting dielectric layer 62. The recess depth of the upper surface of gate electrode 26 below the upper surface of dielectric layer 62 may be about 20 nm to about 200 nm and determines the thickness of a subsequently formed cap 70 (FIGS. 22A,B).

Figure 21A:
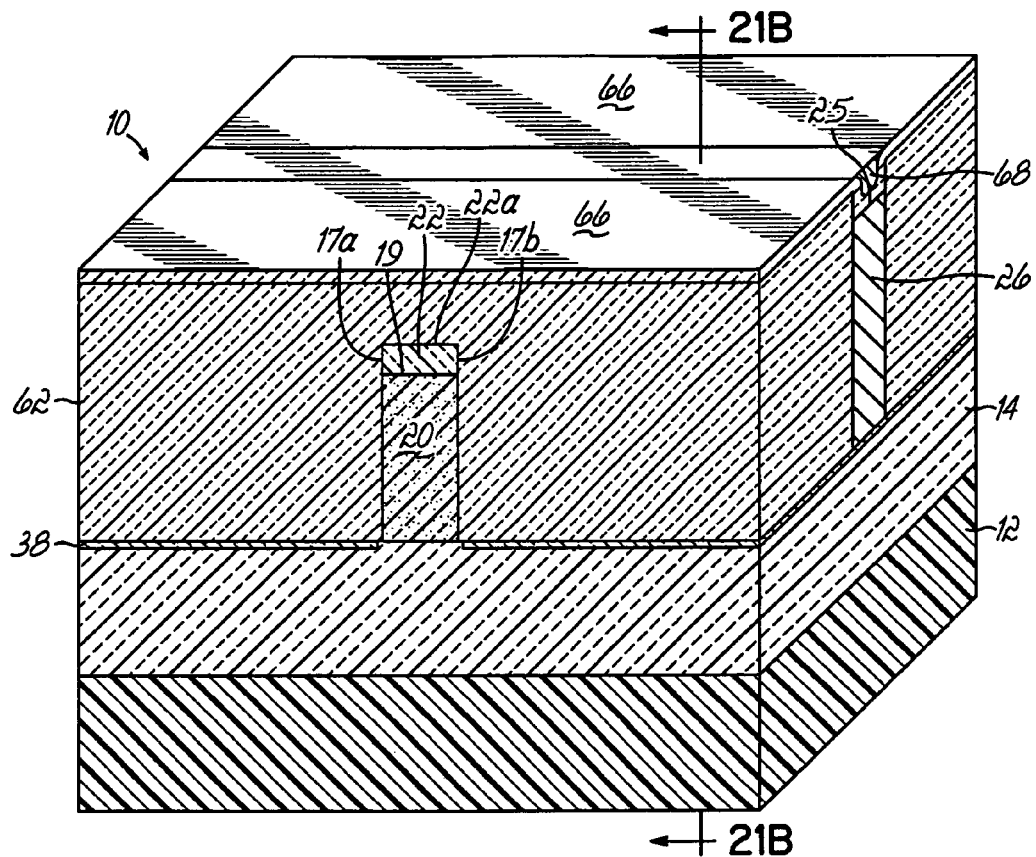
Figure 21B:
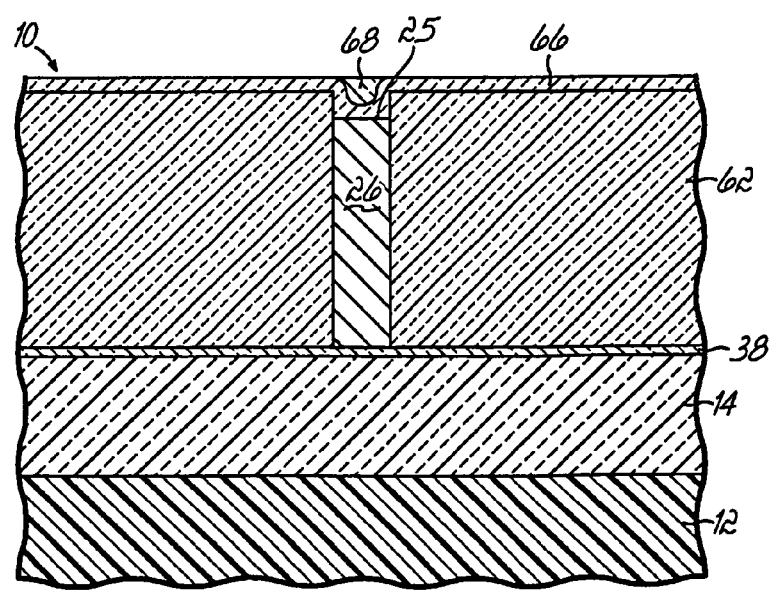

With reference to FIGS. 21 A,B in which like reference numerals refer to like features in FIGS. 20A,B and at a subsequent fabrication stage, a conformal layer 66 of a suitable material, such as CVD silicon nitride, is formed on the semiconductor substrate 10. The conformal layer 66 covers the dielectric layer 62 and partially fills the empty space within the gate trench 64 above the gate electrode 26 created when the gate electrode 26 is recessed (FIGS. 20A,B). The conformal layer 66 may have a thickness ranging from about 10 nm to about 100 nm, as constrained by the depth of the recessed upper surface of the gate electrode 26 below the upper surface of dielectric layer 62. A layer of resist (not shown) is applied on the conformal layer 66 and planarized by an ashing process using, for example, an oxygen plasma or a conventional planarization process, such as a CMP process, that does not significantly thin the conformal layer 66. After planarization, the conformal layer 66 is exposed and free of resist with the exception of a residual resist plug 68 that occupies an open cusp in the conformal layer 66 above the gate electrode 26, which is an artifact of the conformal deposition process and the underlying topography.

Figure 22A:
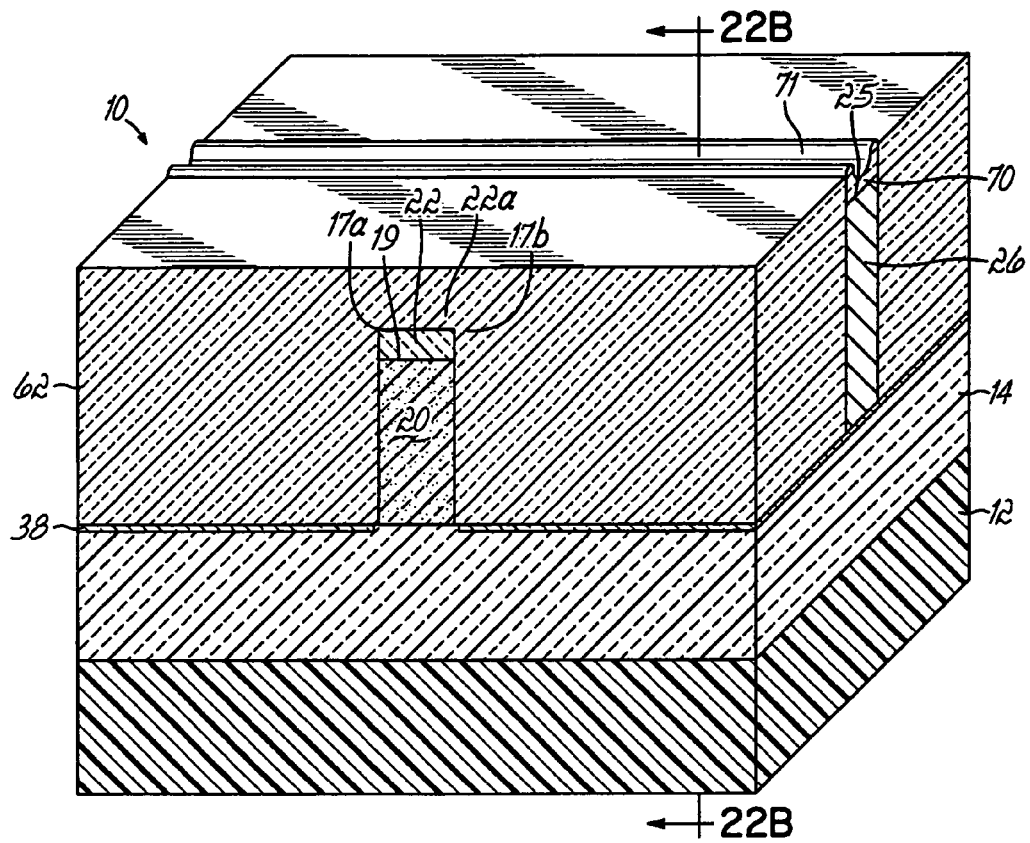
Figure 22B:
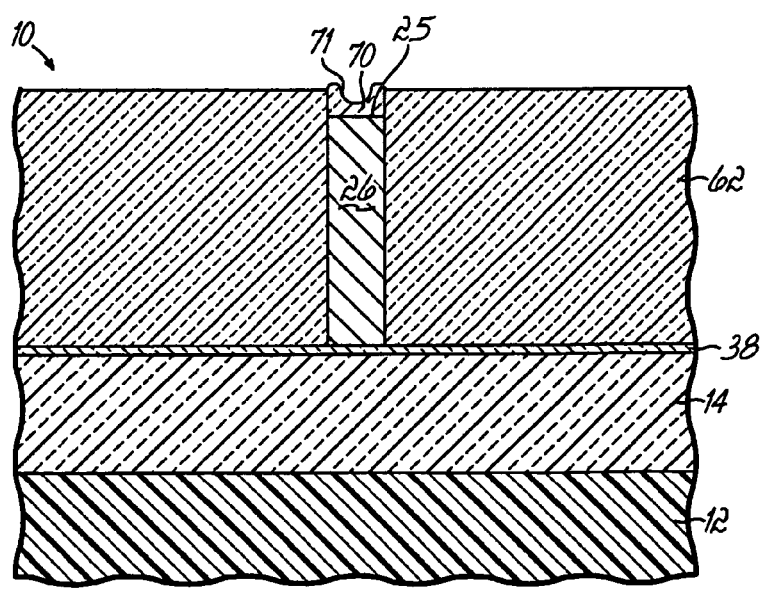

With reference to FIGS. 22A,B in which like reference numerals refer to like features in FIGS. 21A,B and at a subsequent fabrication stage, the conformal layer 66 is anisotropically etched by a conventional dry etching process, such as a RIE or plasma etching process, that removes the constituent material of the conformal layer 66 selective to the resist and to the material constituting the dielectric layer 62. The resist plug 68 masks the underlying portion of the conformal layer 66 within the gate trench 64 during the etching process, which leaves a cap 70 of the dielectric material originally constituting conformal layer 66 over the gate electrode 26. The resist plug 68 is stripped to fully reveal an upper surface 71 of the cap 70.

Figure 23A:
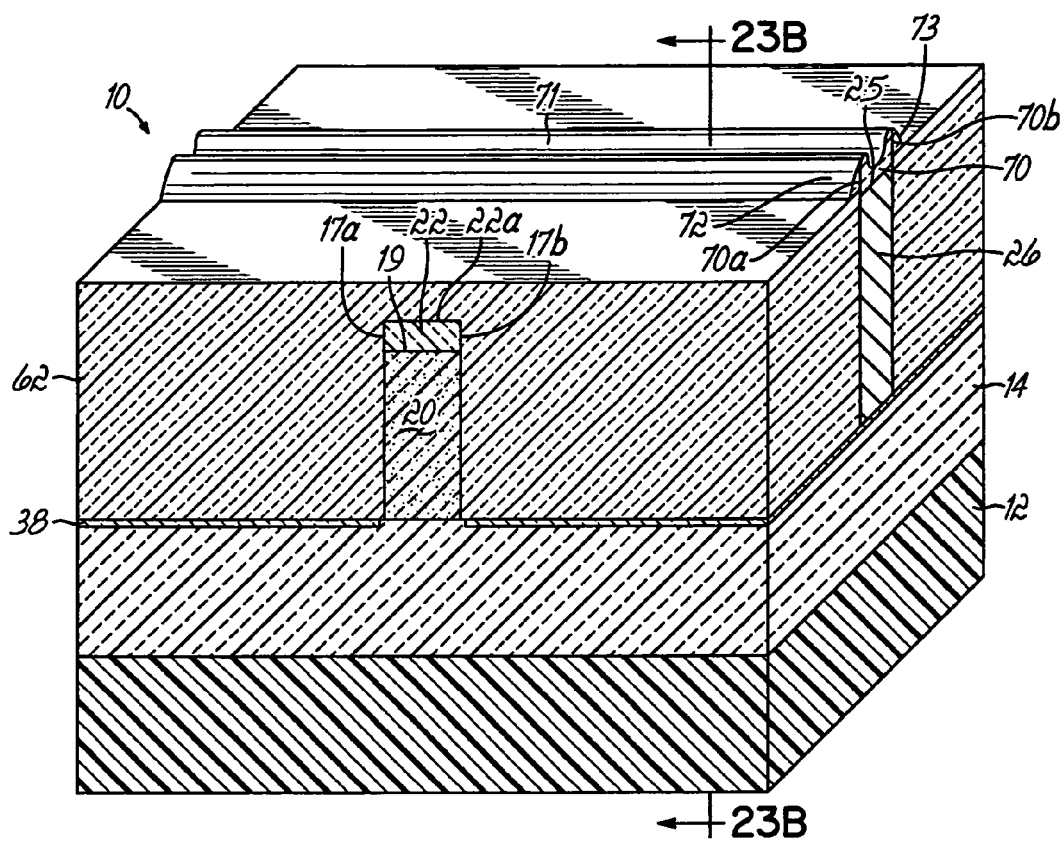
Figure 23B:
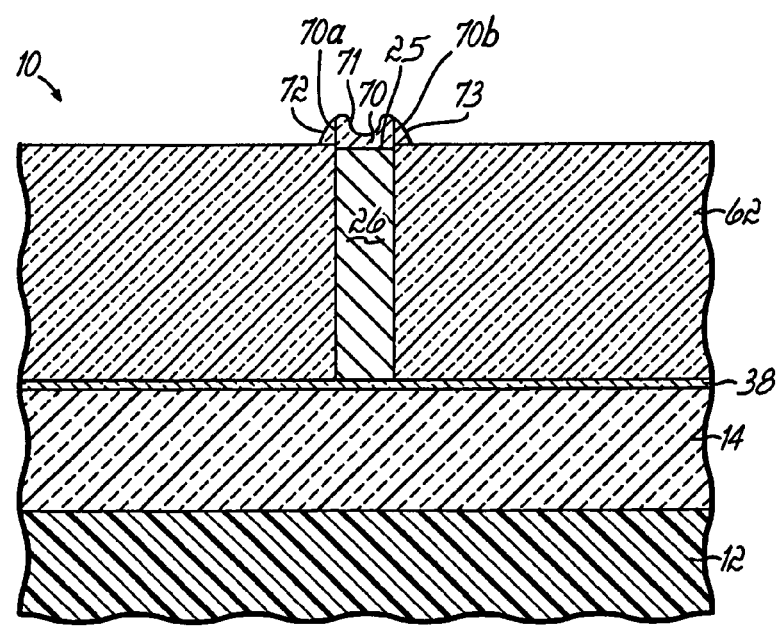

With reference to FIGS. 23A,B in which like reference numerals refer to like features in FIGS. 22A,B and at a subsequent fabrication stage, the material of the dielectric layer 62 is recessed vertically to a minor extent by an anisotropic dry etching process, such as a RIE or plasma etching process, that removes the constituent material of the dielectric layer 62 selective to the material constituting the cap 70. The recessed depth may be about 10 nm to about 150 nm below the horizontal level of the upper surface 71 of the cap 70. A layer of an hard mask material (not shown), such as nitride, is deposited by, for example, a CVD process and etched by an anisotropic dry etching process, such as a RIE or plasma etching process, that removes the hard mask material selective to the constituent material of the dielectric layer 62. Before etching, the layer may have a thickness of about 10 nm to about 100 nm. After the etching process concludes and stops on the dielectric layer 62, cap spacers 72, 73 of the hard mask material remain that flank the sidewalls 70a,b of the cap 70.

With reference to FIGS. 24A,B in which like reference numerals refer to like features in FIGS. 23A,B and at a subsequent fabrication stage that completes the basic semiconductor structure characteristic of the FinFET 53, the dielectric layer 62 is anisotropically etched by, for example, a RIE or plasma process, that removes the constituent material of the dielectric layer 62 selective to the material constituting the cap 70 and cap spacers 72, 73. The cap spacers 72, 73 that flank cap 70 operate as an etch mask for underlying portions of the dielectric layer 62. The anisotropic etching process stops vertically on the modified layer 38 and leaves sidewall spacers 74, 75 of dielectric material, such as oxide, on the sidewalls 27, 29 of the gate electrode 26.

The constituent material of the dielectric layer 62 is removed completely from the sidewalls 21, 23 of the fin 20 along end regions 30, 32, which will be doped during a subsequent fabrication stage to define source/drain regions 48, 50 (FIGS. 8A,B) that flank the channel region 28. In accordance with this embodiment of the present invention, the sidewalls 21, 23 of fin 20 are exposed along end regions 30, 32 after the dielectric layer 62 is removed. Additional processing is not required to remove any coating, such as a gate dielectric or a protective nitride, in preparation for doping the source/drain regions 48, 50. The source/drain regions 48, 50, which flank the channel region 28, are then formed by a conventional angled ion implantation technique that introduces ions 52 of a suitable n-type or p-type dopant and with a suitable dose and low kinetic energy into the sidewalls 21, 23 of fin 20 along end regions 30, 32. The mask supplied by the cap 70 and sidewall spacers 74, 75 inhibits the introduction of the dopant into the gate electrode 26 and, advantageously, may prohibit dopant introduction into the gate electrode 26 from the process forming the source/drain regions 48, 50.

In the various embodiments of the present invention, the gate electrode 26 is completely encapsulated by the cap 34 and sidewall spacers 46, 47 (FIGS. 8A,B), the cap 34, sidewall spacers 60, 61, and sidewall spacers 60a, 61a (FIGS. 13A,B), or the cap 70 and sidewall spacers 74, 75 (FIGS. 24A,B) before the fabrication stage that introduces a dopant concentration into the source/drain regions 48, 50. The beneficial result of this masking is that the process introducing the dopant into the source/drain regions 48, 50 does not also introduce an additional concentration of a dopant into the gate electrode 26 or, at the least, introduces an insignificant dopant concentration from this process. Because the source/drain regions 48, 50 are doped independent of the doping of the gate electrode 26, the gate work function of the gate electrode 26 may be set independently of the doping of the source/drain regions 48, 50. This overcomes a significant deficiency of conventional FinFET's and conventional methods for forming FinFET's in which introducing a dopant concentration into the source/drain regions 48, 50 elevates the doping level of the gate electrode 26.

Advantageously, dielectric sidewall spacers 46, 47 and 74, 75 are formed on the sidewalls of a pre-doped gate electrode 26, as well as caps 34 and 70 formed on the upper surface 25 of the gate electrode 26. After the gate electrode 26 is formed of a first work function material or a first doping type and encapsulated, a second work function material or a second doping type is introduced into the source/drain regions 48, 50 without disturbing the work function of the gate electrode 26. This ability to independently dope the gate electrode 26 and the source/drain regions 48, 50 provides a circuit designer with improved flexibility in selecting the threshold voltage of the FinFET 53, especially in fully-depleted or lightly doped fins 20. For example, an n-channel MOSFET with $n^+$ gate doping (i.e., gate fermi-level at conduction band edge) would have a threshold voltage that is approximately 1.1 volts lower than the same transistor with $p^+$ gate doping (i.e., gate fermi-level at valence band edge). Gate electrodes 26 formed from materials having various different work functions may be used to reliably and reproducibly obtain a plurality of threshold voltages. The dielectric sidewall spacers 46, 47 and 74, 75 on the sidewalls of a pre-doped and electrically-conductive gate electrode 26 are formed without the aid of a mask (i.e., maskless) on a conductor, represented by gate electrode 26.

Figure 6B:
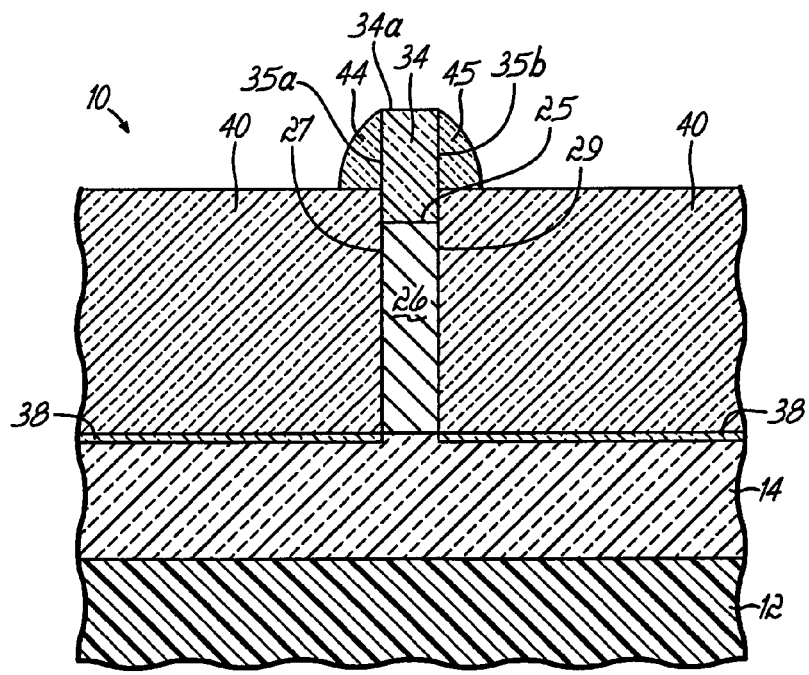

In an alternative embodiment of the present invention, the fin 20 and gate electrode 26 may be considered to define two vertically-spaced wiring levels of conductive material that are electrically isolated from each other. Specifically, the fin 20 and gate electrode 26 may each represent interconnect metallization lines (i.e., wiring) of patterned conductive layers that extend laterally across the surface of the semiconductor wafer 10. These two interconnect metallization lines may each participate in a distinct wiring level from among a plurality of wiring levels used to electrically connect to devices and, thereby, to complete the desired functional integrated circuit. As is well known, patterned conductive layers are insulated from other nearby conductive layers by intralevel and interlevel layers of dielectric materials, such as silicon dioxide. The upper surface of the cap on the first wiring level, which is represented by the cap 34 on the extended gate electrode 26, is higher than the upper surface of the cap on the second wiring level, which is represented by the cap 22 on extended fin 20. As a consequence, spacers, similar to cap spacers 44, 45 (FIGS. 6A, 6B) may formed that flank the cap 34 on the gate electrode 26 without forming spacers that flank the cap 22 on the fin 20. Instead, a layer of dielectric material, such as dielectric layer 40 (FIGS. 4A,B), masks the lower metallization line, which is represented by the extended fin 20, and is recessed to reveal the cap 34 on the upper metallization line, which is represented by the extended gate electrode 26.

References herein to terms such as "vertical", "horizontal", etc. are made by way of example, and not by way of limitation, to establish a frame of reference. The term "horizontal" as used herein is defined as a plane parallel to the conventional plane or surface of semiconductor wafer 10, regardless of the actual spatial orientation of semiconductor wafer 10. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for fabricating a FinFET structure, the method comprising:
    forming a fin body of semiconductor material having a central channel region and first and second end regions flanking the central channel region;
    forming a gate electrode having a plurality of sidewalls intersecting the central channel region of the fin body;
    forming a cap on the gate electrode;
    depositing a dielectric material that covers the fin body and the gate electrode;
    recessing the dielectric material to partially expose the cap on the gate electrode without exposing the sidewalls of the gate electrode;
    forming a plurality of cap spacers flanking the cap on the gate electrode to mask underlying portions of the dielectric material flanking the sidewalls of the gate electrode;
    anisotropically etching the dielectric material to encapsulate the gate electrode by defining a sidewall spacer on each of the sidewalls of the gate electrode from the portion of the dielectric material masked by a respective one of the cap spacers and to reveal the first and second end regions of the fin body; and
    after the dielectric material is anisotropically etched, introducing a dopant into the first and second end regions of the fin body to define source/drain regions.

2. The method of claim 1 wherein a cap overlies the fin body, and the dielectric layer buries the cap on the fin body so that additional cap spacers are not formed flanking the cap on the fin body when the cap spacers are formed flanking the cap on the gate electrode.

3. The method of claim 1 wherein the fin body and the gate electrode are supported on a surface of a dielectric substrate, and further comprising:
    forming an etch stop layer at the surface of the dielectric substrate before the dielectric material is deposited.

4. The method of claim 1 wherein forming the gate electrode further comprises:
    forming a trench in the dielectric material that intersects the central channel region of the fin body; and
    filling the trench with a conductor material to form the gate electrode.

5. The method of claim 4 further comprising:
    forming a gate dielectric on the central channel region of the fin body, before the gate electrode is formed, so that the gate dielectric is positioned between the fin body and the gate electrode across the central channel region.

6. The method of claim 1 wherein the dielectric layer buries the fin body so that spacers are not formed on the fin body when the cap spacers are formed.

7. A method for fabricating a semiconductor structure, the method comprising:
    forming a first feature;
    forming a second feature having a plurality of sidewalls;
    forming a cap on the second feature;
    depositing a dielectric material that covers the first and second features;
    recessing the dielectric material to partially expose the cap on the second feature without exposing the sidewalls of the second feature;
    forming a plurality of cap spacers flanking the cap on the second feature to mask underlying portions of the dielectric material flanking the sidewalls of the second feature; and anisotropically etching the dielectric material to encapsulate the second feature by defining a sidewall spacer on each of the sidewalls of the second feature from the portion of the dielectric material masked by a respective one of the cap spacers and to reveal the first feature.

8. The method of claim 7 wherein a cap overlies the first feature, and the dielectric layer buries the cap on the first feature so that cap spacers are not formed flanking the cap on the first feature when the cap spacers are formed flanking the cap on the gate electrode.

9. The method of claim 7 wherein the first feature and the second feature are supported on a surface of a dielectric substrate, and further comprising:

forming an etch stop layer at the surface of the dielectric substrate before the dielectric material is deposited.

10. The method of claim 7 wherein forming the second feature further comprises:

forming a trench in the dielectric material; and filling the trench with a conductor material to form the second feature.

11. The method of claim 7 wherein anisotropically etching the dielectric material further comprises:

revealing at least a portion of the first feature.

12. The method of claim 7 wherein the first and second features are each formed from a conductive material.

13. The method of claim 7 wherein the first feature is a fin body of a FinFET and the second feature is a gate electrode of the FinFET.

14. The method of claim 7 wherein the dielectric layer buries the first feature so that spacers are not formed on the first feature when the cap spacers are formed.

* * * * *